United States Patent
Nakamura et al.

(10) Patent No.: US 6,580,099 B2
(45) Date of Patent: Jun. 17, 2003

(54) NITRIDE SEMICONDUCTOR LIGHT-EMITTING DEVICES

(75) Inventors: Shuji Nakamura, Tokushima (JP); Shinichi Nagahama, Komatsushima (JP); Naruhito Iwasa, Tokushima (JP); Hiroyuki Kiyoku, Tokushima-ken (JP)

(73) Assignee: Nichia Chemical Industries, Ltd., Anan (JP)

( * ) Notice: Subject to any disclaimer, the term of this patent is extended or adjusted under 35 U.S.C. 154(b) by 0 days.

(21) Appl. No.: 09/973,817

(22) Filed: Oct. 11, 2001

(65) Prior Publication Data

US 2002/0167019 A1 Nov. 14, 2002

Related U.S. Application Data

(63) Continuation of application No. 09/370,170, filed on Aug. 9, 1999, now abandoned.

(30) Foreign Application Priority Data

| Dec. 2, 1994 | (JP) | 6-299446 |
| Dec. 2, 1994 | (JP) | 6-299447 |
| Dec. 22, 1994 | (JP) | 6-320100 |
| Feb. 23, 1995 | (JP) | 7-034924 |
| Mar. 16, 1995 | (JP) | 7-057050 |
| Mar. 16, 1995 | (JP) | 7-057051 |
| Apr. 14, 1995 | (JP) | 7-089102 |

(51) Int. Cl.$^7$ ............... H01L 29/24; H01L 31/0328; H01L 29/22; H01L 29/06
(52) U.S. Cl. ............ 257/103; 257/94; 257/18
(58) Field of Search ............ 257/94, 103, 18, 257/14; 372/45

(56) References Cited

U.S. PATENT DOCUMENTS

| 4,941,146 A | 7/1990 | Kobayashi ............... 372/45 |
| 5,132,750 A | 7/1992 | Kato et al. |
| 5,146,465 A | 9/1992 | Khan et al. |
| 5,237,581 A | 8/1993 | Asada et al. |
| 5,592,501 A * | 1/1997 | Edmond et al. ............ 372/45 |
| 5,602,418 A | 2/1997 | Imai et al. |
| 5,642,376 A | 6/1997 | Olbright et al. |
| 5,652,434 A | 7/1997 | Nakamura et al. |
| 5,670,798 A | 9/1997 | Schetzina |
| 5,734,182 A | 3/1998 | Nakamura et al. |
| 5,793,054 A | 8/1998 | Nido ..................... 257/18 |

FOREIGN PATENT DOCUMENTS

| EP | 0 496 030 A2 | 7/1992 |
| JP | 60-97684 | 5/1985 |
| JP | 62-1290 | 1/1987 |
| JP | 1-264275 | 10/1989 |
| JP | 4-68579 | 3/1992 |

(List continued on next page.)

OTHER PUBLICATIONS

Japan J. Appl. Phys. vol. 34 (1995) pp. L797–L799.
Japan J. Appl. Phys. vol. 34 (1995) pp. L332–L–1335.
Applied Physics Leitt 67 (13) 9/95.

(List continued on next page.)

*Primary Examiner*—Amir Zarabian
*Assistant Examiner*—Kiesha Rose
(74) *Attorney, Agent, or Firm*—Nixon & Vanderhye P.C.

(57) ABSTRACT

A nitride semiconductor light-emitting device has an active layer of a single-quantum well structure or multi-quantum well made of a nitride semiconductor containing indium and gallium. A first p-type clad layer made of a p-type nitride semiconductor containing aluminum and gallium is provided in contact with one surface of the active layer. A second p-type clad layer made of a p-type nitride semiconductor containing aluminum and gallium is provided on the first p-type clad layer. The second p-type clad layer has a larger band gap than that of the first p-type clad layer. An n-type semiconductor layer is provided in contact with the other surface of the active layer.

4 Claims, 6 Drawing Sheets

FOREIGN PATENT DOCUMENTS

| | | |
|---|---|---|
| JP | 5-291618 | 11/1993 |
| JP | 5-335662 | 12/1993 |
| JP | 06-021511 | 1/1994 |
| JP | 06-164055 | 6/1994 |
| JP | 6-177423 | 6/1994 |
| JP | 06-268257 | 9/1994 |
| JP | 6-268259 | 9/1994 |
| JP | 6-283825 | 10/1994 |
| JP | 7-15041 | 1/1995 |
| JP | 7-202325 | 8/1995 |
| JP | 7-249795 | 9/1995 |
| JP | 9-36424 | 2/1997 |

OTHER PUBLICATIONS

Nakamura et al., 320 Applied Physics Letters 67 Sep. 25, 1995, No. 13 *High–Power InGaN Single Quantum–Well–Structure Blue and Violet Light Emitting Diodes*.

Khan et al., *Reflective Filters Based on Single–Crystal GaN/AlxGal–xN Multilayers Deposited Using Low–Pressure Metalorganic Chemical Vapor Deposition*, Appl. Phys. Lett., vol. 59, No. 12 (1991).

* cited by examiner

NITRIDE SEMICONDUCTOR LIGHT-EMITTING DEVICES

This application is a continuation of application Ser. No. 09/370,170, filed Aug. 9, 1999, the entire content of which is hereby incorporated by reference in this application.

BACKGROUND OF THE INVENTION

1. Field of the Invention

The present invention relates to a semiconductor light-emitting device such as a light-emitting diode (LED) or a laser diode (LD), and in particular to a light-emitting device having a semiconductor structure formed of all nitride semiconductor materials.

2. Description of the Related Art

As materials for a light-emitting device such as an LED or LD device which is expected of emitting a light ranging from ultraviolet to red, nitride semiconductor materials ($In_xAl_yGa_{1-x-y}N$; $0 \leq x$, $0 \leq y$, $x+y \leq 1$) are known, and blue and blue-green LEDs have been put to practical use in, for example, displays or signals.

The light-emitting device such as a blue LED or a blue-green LED formed of nitride semiconductor materials and now actually used has a double-heterostructure. This light-emitting device is fundamentally constructed such that an n-type contact layer consisting of an n-type GaN, an n-type clad layer consisting of an n-type AlGaN, an n-type active layer consisting of an n-type InGaN, a p-type clad layer consisting of a p-type AlGaN and a p-type contact layer consisting of a p-type GaN are superimposed on a substrate made for example of sapphire in the order mentioned. The active layer is doped with a donor impurity such as Si or Ge and/or an acceptor impurity such as Mn or Mg. The light emission wavelength of the LED device can be changed from the ultraviolet region to the red region by varying the content of In in the composition of InGaN of the active layer or by changing the kind of impurities to be doped into the active layer. The LED now put to practical use is an LED having an emission wavelength of 510 nm or less, with its active layer doped with both of donor and acceptor impurities. This LED is has a buffer layer formed of, for example, GaN or AlN between the substrate and the n-type contact layer.

On the other hand, there have been many proposals on a structure of an LD device to date. For example, Unexamined Japanese Patent Application Publication (Kokai) 6-21511 discloses a separation confinement type LD having a structure wherein an active layer consisting of InGaN and having a thickness of not more than 100 angstroms is interposed between an n-type GaN layer and a p-type GaN layer, and the resultant composite is further sandwiched between an n-type AlGaN layer and a p-type AlGaN layer. Both of the AlGaN layers functioning as a light confinement layer.

Through the realization of a double-heterostructure in an LED device as explained above, it has become possible to improve the light-emitting output, thus enabling the LED device to be actually used. However, since an InGaN layer doped with impurities is utilized as an active layer in this LED device, this LED device is accompanied with a drawback that the half band width of emission spectrum can not avoid from becoming wide. For example, a full color display provided with an LED device having a luminescent spectrum of wide half band width will exhibit a whitish luminescent light, thus narrowing the color-reproducing region thereof.

As for LD device, it is theoretically possible to realize a laser oscillation in a double-heterostructure comprising an active layer formed of a non-doped InGaN as described in the above-mentioned Unexamined Japanese Patent Application Publication 6-21511, but the laser oscillation is not yet realized with such a double-heterostructure. It is expected to greatly improve the emission output by making the active layer into a quantum well structure as described in this Publication. However, there are many problems to be solved, such as the preparation of an optical resonance surface or of an optical confinement layer, before the LD device can be actually realized.

In order to realize an LD device, the active layer thereof is required to exhibit a sharp and strong band-to-band emission. Even with an LED device, it is possible to obtain an emission spectrum having a narrow half band width, provided a band-to-band emission can be realized. However, the thickness of the active layer in the conventional LED device is relatively thick, i.e., 0.1 to 0.2 $\mu$m, thus the thickness of InGaN layer hetero-epitaxially grown on an AlGaN layer already exceeds over the critical thickness, so that it was impossible with the conventional LED device to realize a strong band-to-band emission, thus failing to realize a laser oscillation. Meanwhile, if an LED device is formed into a quantum well structure by greatly thinning the active layer as shown in the above-mentioned Unexamined Japanese Patent Application Publication 6-21511, it may be possible to obtain a strong band-to-band emission. However, if the thickness of the active layer is thinned, the light confinement may then become insufficient thus making it impossible to realize a laser oscillation.

SUMMARY OF THE INVENTION

Therefore, a first object of the present invention is to provide a nitride semiconductor light-emitting device which is capable of generating an excellent laser oscillation.

A second object of the present invention is to provide a nitride semiconductor light-emitting device which is capable of exhibiting an improved emission output.

These and other objects which will become apparent from the following detailed description have been achieved according to the present invention by a nitride semiconductor light-emitting device comprising:

an active layer of a quantum well structure comprising a nitride semiconductor containing indium and gallium, and having first and second main surfaces;

a first p-type clad layer comprising a p-type nitride semiconductor containing aluminum and gallium, and provided in contact with the second main surface of the active layer;

a second p-type clad layer comprising a p-type nitride semiconductor containing aluminum and gallium, having a larger band gap than that of the first p-type clad layer, and provided on the first p-type clad layer; and an n-type semiconductor layer provided in contact with the first main surface of the active layer.

According to the present invention, there is further provided a nitride semiconductor light-emitting device comprising:

an active layer comprising of a quantum well structure comprising a nitride semiconductor containing indium and gallium, and having first and second main surfaces;

a first n-type clad layer made of an n-type nitride semiconductor containing aluminum and gallium or of an n-type GaN, and provided in contact with the first main surface of the active layer, the first n-type clad layer having a thickness within a range of 10 angstroms to 1.0 $\mu$m;

a second n-type clad layer comprising an n-type nitride semiconductor having a larger band gap than that of the first n-type clad layer, and provided on the first n-type clad layer; and a p-type semiconductor layer provided in contact with the second main surface of the active layer.

According to the present invention, there is further provided a nitride semiconductor light-emitting device comprising:

an active layer of a quantum well structure comprising a nitride semiconductor containing indium and gallium, and having first and second main surfaces;

a first n-type clad layer made of an n-type nitride semiconductor containing aluminum and gallium, or of an n-type GaN, and provided in contact with the first main surface of the active layer;

a second n-type clad layer comprising an n-type nitride semiconductor having a larger band gap than that of the first n-type clad layer, and provided on the first n-type clad layer;

a first p-type clad layer comprising a p-type nitride semiconductor containing aluminum and gallium, and provided in contact with the second main surface of the active layer; and a second p-type clad layer comprising a p-type nitride semiconductor containing aluminum and gallium, having a larger band gap than that of the first p-type clad layer, and provided on the first p-type clad layer.

According to the present invention, there is further provided a nitride semiconductor light-emitting device comprising an active layer of a quantum well structure comprising a nitride semiconductor containing indium and gallium and interposed between an n-type nitride semiconductor layer and a p-type semiconductor layer, the p-type semiconductor layer including a p-type clad layer provided in contact with the active layer, the p-type clad layer comprising a p-type nitride semiconductor containing aluminum and gallium and having a thickness within a range of 10 angstroms to 1.0 μm.

According to the present invention, there is further provided a nitride semiconductor light-emitting device comprising an active layer of quantum well structure interposed between an n-type nitride semiconductor layer and a p-type semiconductor layer, the active layer comprising a nitride semiconductor containing indium and gallium, and provided with a well layer having a thickness of not more than 70 angstroms.

According to the present invention, there is further provided a nitride semiconductor light-emitting device comprising an active layer of a quantum well structure having first and second main surfaces, and comprising a nitride semiconductor containing indium and gallium; and a first n-type clad layer comprising an n-type nitride semiconductor containing indium and gallium.

According to the present invention, there is further provided a nitride semiconductor light-emitting device comprising an active layer of a quantum well structure having first and second main surfaces, and comprising a nitride semiconductor containing indium and gallium; and a first p-type clad layer comprising a p-type nitride semiconductor containing indium and gallium.

According to the present invention, there is further provided a nitride semiconductor light-emitting device comprising:

an active layer comprising a nitride semiconductor containing indium and gallium, and having first and second main surfaces;

a first n-type clad layer comprising an n-type nitride semiconductor not containing aluminum, and provided in contact with the first main surface of the active layer; and a p-type clad layer comprising a p-type nitride semiconductor and having a surface region, at least the surface region comprising a p-type nitride semiconductor containing aluminum and gallium, the p-type clad layer being provided in contact with the second main surface of the active layer.

According to the present invention, there is further provided a nitride semiconductor light-emitting device comprising an active layer of a quantum well structure comprising a nitride semiconductor; an negative electrode; a positive electrode; an n-type GaN contact layer provided in contact with the negative electrode; and a p-GaN contact layer provided in contact with the positive electrode.

According to the present invention, there is further provided a nitride semiconductor light-emitting device comprising an active layer having first and second main surfaces, and comprising a nitride semiconductor containing indium and gallium; and a first n-type clad layer comprising an n-type nitride semiconductor containing indium and gallium, having a larger band gap than the active layer, and being provided in contact with the first main surface of the active layer.

According to the present invention, there is further provided a nitride semiconductor light-emitting device comprising an active layer having first and second main surfaces, and comprising a nitride semiconductor containing indium and gallium; and a first p-type clad layer comprising a p-type nitride semiconductor containing indium and gallium, having a larger band gap than the active layer, and being provided in contact with the second main surface of the active layer.

According to the present invention, there is further provided a nitride semiconductor light-emitting device comprising:

an active layer comprising a nitride semiconductor containing indium and gallium, and having first and second main surfaces;

a first n-type clad layer comprising an n-type nitride semiconductor containing indium and gallium, having a larger band gap than that of the active layer, and provided in contact with the first main surface of the active layer;

a first p-type clad layer comprising a p-type nitride semiconductor containing indium and gallium, having a larger band gap than that of the active layer, and provided in contact with the second main surface of the active layer;

a second n-type clad layer comprising an n-type nitride semiconductor containing aluminum and gallium, having a larger band gap than that of the first n-type clad layer, and provided in contact with the first n-type clad layer; and a second p-type clad layer comprising a p-type nitride semiconductor containing aluminum and gallium, having a larger band gap than that of the first p-type clad layer, and provided on the first p-type clad layer.

According to the present invention, there is further provided a nitride semiconductor light-emitting device comprising an active layer comprising a nitride semiconductor containing at least indium and interposed between a first n-type clad layer comprising an n-type nitride semiconductor having a smaller thermal expansion coefficient than that of the active layer and a first p-type clad layer comprising a p-type nitride semiconductor having a smaller thermal expansion coefficient than that of the active layer, wherein the active layer is of a single-quantum well structure or of a multi-quantum well structure, thereby to emit a light of lower energy than the inherent band gap energy of the nitride semiconductor forming the active layer.

According to the present invention, there is further provided a nitride semiconductor light-emitting device comprising a first n-type clad layer made of an n-type nitride semiconductor containing indium or of an n-type GaN; and an active layer comprising a nitride semiconductor containing indium, having a larger thermal expansion coefficient than that of the first n-type clad layer and provided in contact with the first n-type clad layer, wherein the active layer is of a single-quantum well structure or of a multi-quantum well structure, thereby to emit a light of lower energy than the inherent band gap energy of the nitride semiconductor forming the active layer.

According to the present invention, there is further provided a nitride semiconductor light-emitting device comprising an active layer comprising a nitride semiconductor containing indium; and a first p-type clad layer comprising a p-type nitride semiconductor containing aluminum, having a larger thermal expansion coefficient than that of the active layer and provided in contact with the active layer wherein the active layer is of a single-quantum well structure or of a multi-quantum well structure, thereby to emit a light of lower energy than the inherent band gap energy of the nitride semiconductor forming the active layer.

DETAILED DESCRIPTION OF THE PREFERRED EMBODIMENT

In the following description, $In_xGa_{1-x}N$ ($0<x<1$) is sometimes referred to simply as InGaN. Likewise, ($0<y<1$) is sometimes referred to simply as $Al_yGa_{1-y}N$.

According to a first embodiment of the present invention, there is provided a nitride semiconductor light-emitting device provided with an active layer interposed between an n-type nitride semiconductor layer and a p-type nitride semiconductor layer, the active layer being formed of a nitride semiconductor containing indium and gallium, and constructed into a quantum well structure (single-quantum well or multi-quantum well structure). The above mentioned p-type nitride semiconductor layer comprises, as mentioning from the active layer side, a first p-type clad layer formed of a p-type nitride semiconductor containing aluminum and gallium, and a second p-type clad layer having a larger band-gap than that of the first p-type clad layer and formed of a p-type nitride semiconductor containing aluminum and gallium.

Figure 1:
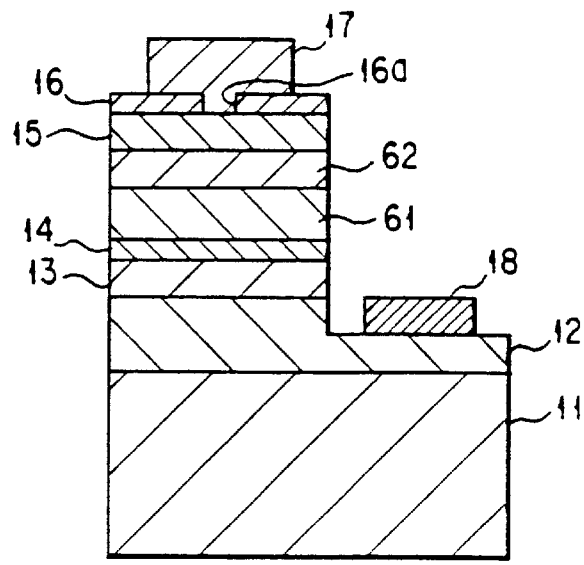
FIG. 1 is a cross-sectional view schematically illustrating a structure of a light-emitting device according to a first embodiment of the present invention.

FIG. 1 shows a cross-sectional view schematically illustrating a structure of a light-emitting device (LD structure) according to the first embodiment of the present invention. Referring to FIG. 1, the light-emitting device comprises a substrate 11 on which an n-type contact layer 12, an n-type clad layer 13, an active layer 14, a first p-type clad layer 61, a second p-type clad layer 62 and a p-type contact layer 15 are superimposed in the mentioned order. On the surface of the p-type contact layer 15, there is formed a current-contracting layer 16 formed of an insulating material and having an opening 16a formed therein. On the surface of this current-contracting layer 16 is formed a positive electrode (p-electrode) 17 connected to the p-type contact layer 15 through the opening 16a. On the other hand, a negative electrode (n-electrode) 18 is formed on the surface of the n-type contact layer 12. In the case of an LED device, the positive electrode 17 is directly formed on the p-type contact layer 15, without forming the current-contracting layer 16.

The substrate 11 may be made of sapphire (including the C-plane, R-plane and A-plane thereof), SiC (including 6H—SiC and 4H—SiC), Si, ZnO, GaAs, spinel ($MgAl_2O_4$, particularly (111) plane), and a monocrystalline oxide having a lattice constant which is close to that of the nitride semiconductor may be employed. Among them, sapphire and SiC are generally employed. Although a buffer layer is not specifically shown in FIG. 1, a buffer layer formed of GaN or AlN several hundred angstroms in thickness is often formed between the substrate and the nitride semiconductor for the purpose of relieving the mismatching of lattice constants of these materials. Since, however, this buffer layer can be omitted if the substrate is formed of SiC or ZnO whose lattice constant is very close to that of the nitride semiconductor, the buffer layer is not shown in FIG. 1.

The n-type contact layer 12 may be formed of a n-type nitride semiconductor. If it is formed of a binary or ternary mixed crystal such as GaN or AlGaN, a contact layer of excellent crystallinity can be obtained. If the n-type contact layer 12 is formed of GaN in particular, an excellent ohmic contact with a negative electrode material can be achieved. A preferable n-conductivity can be obtained by doping the contact layer with a donor impurity such as Si, Ge or S. As for the materials for the negative electrode 18, the use of a metallic material containing both Ti and Au, or both Ti and Al is preferable.

The n-type clad layer 13 may be formed of a p-type nitride semiconductor. If it is formed of a binary or ternary mixed crystal such as GaN, AlGaN or InGaN, a clad layer of excellent crystallinity can be obtained. If the n-type clad layer 13 is formed of InGaN or GaN in particular, the formation of a relatively thin active layer 14 can be made possible, so that an active layer of a single-quantum well (SQW) or a multi-quantum well (MQW) structure will be realized, thus greatly improving the output of the light-emitting device. It is possible to omit the n-type clad layer 13 in an LED device. The n-type clad layer 13 should desirably be formed in the case of an LED device to a thickness ranging from 10 angstroms to 1.0 $\mu$m, preferably from 30 angstroms to 0.1 $\mu$m, while in the case of an LD device to a thickness ranging from 100 angstroms to 1.0 $\mu$m.

The active layer 14 should most preferably be formed of a non-doped InGaN (no impurity is doped), thereby allowing an emission of 660 nm to 365 nm to be obtained through a band-to-band emission. In order to prepare an InGaN active layer of excellent crystallinity having a thickness which is sufficiently thin enough to provide a single-quantum well or multi-quantum well structure, it is very preferable to form in advance, as an n-type clad layer 13, an InGaN layer having a larger band gap than the active layer 14 that will be subsequently grown on this InGaN layer.

When the active layer 14 is of an SQW or MQW structure, a device of very high emission output can be obtained. By the expressions of SQW and MQW structures, it is meant a structure of active layer from which a light emission of inter-quantum level through a non-doped $In_xGa_{1-x}N$ composition can be obtained. For example, an active layer of the SQW structure is constituted by a single layer (well layer) formed of a single composition of $In_xGa_{1-x}N$ (0<x<1), and the clad layers 13 and 61 sandwiching the active layer constitute barrier layers. When the thickness of this $In_xGa_{1-x}N$ layer is 100 angstroms or less, the active layer undergoes a plastic deformation, thus making it possible to obtain a strong light emission of inter-quantum level. On the other hand, an active layer of the MQW structure is formed of a laminate of well and barrier layers, alternately stacked. The well and barrier layers may consist of $In_xGa_{1-x}N$ layer (in this case, x may be from 0 to 1) different in composition from each other. In an active layer of the MQW structure, the two outermost thin films of the active layer constitute well layers. When the active layer is of an SQW or MQW structure, it is possible to obtain a visible LED of high output of inter-quantum level light emission having a wavelength ranging from about 365 nm to 660 nm. When the thickness of the well layer of the quantum well structure is not more than 70 angstroms, preferably not more than 50 angstroms, a light-emitting device of high emission output will be obtained. This in turn indicates that this degree of thickness is not more than the critical thickness of the InGaN active layer. Since the Bohr radius of electron in the InGaN is about 30 angstroms, the quantum effect of the InGaN is obtained when the thickness is 70 angstroms or less.

Likewise, it is preferable in the case of multi-quantum well structure to adjust the thickness of the well layer to 70 angstroms or less, and to adjust the thickness of the barrier layer to 150 angstroms or less.

Next, the first p-type clad layer 61 also featuring the first embodiment of the present invention will be explained below.

This first p-type clad layer 61 is formed of a p-type nitride semiconductor containing Al and Ga, and most preferably is formed of a ternary mixed crystal of AlGaN. This first p-type clad layer 61 functions as a light-guiding layer in an LD device. Namely, in the case of an LD device according to the first embodiment of the present invention, if the thickness of the active layer 14 is made sufficiently thin to provide a quantum well structure, the confinement of light within the active layer 14 may become insufficient. Therefore, this first p-type clad layer 61 is provided for functioning it as a light-guiding layer for confining light. Moreover, the AlGaN layer is most preferable because it can be easily made into a p-type layer of high carrier concentration, and at the same time is suited for enlarging a difference in band offset or refractive index thereof relative to the InGaN active layer 14 as compared with other kinds of nitride semiconductors. Additionally, as compared with other kinds of nitride semiconductors, a p-type AlGaN is less susceptible to decomposition during the growth thereof, so that it has an effect of inhibiting the decomposition of InGaN of the active layer as it is grown by way of the MOVPE method for example. Because of this, an active layer of excellent crystallinity can be obtained, thus improving the output thereof. Under the circumstances, the first p-type clad layer should most preferably be made of AlGaN. On the other hand, if the first p-type clad layer is formed of a p-type GaN, the emission output will be decreased to ⅓ of the case where the p-type AlGaN is employed. The reason of this phenomenon may be ascribed to the facts that GaN is less likely to be turned into p-type as compared with AlGaN and that GaN is more likely to be decomposed during the growth thereof, deteriorating the crystallinity thereof; but details are not clear yet.

The thickness of the first p-type clad layer 61 made of a p-type AlGaN should preferably be in the range of 10 angstroms to 1.0 $\mu$m, more preferably 10 angstroms to 0.5 $\mu$m. If the first p-type clad layer 61 is thinner than 10 angstroms, any advantage to be obtained by the presence of the first p-type clad layer may be lost, giving rise to the decomposition of the active layer, thus causing the lowering of emission output. On the other hand, if the first p-type clad layer 61 is thicker than 1.0 $\mu$m, a crack is more likely to be formed in the first p-type clad layer 61, making it difficult to form a satisfactory device.

In the case of an LD device in particular, the thickness of the first p-type clad layer 61 should preferably be within the range of 100 angstroms to 1.0 $\mu$m, more preferably 100 angstroms to 0.5 $\mu$m. If the first p-type clad layer 61 is thinner than 100 angstroms, the function thereof as a light-guiding layer may be lost. On the other hand, if the first p-type clad layer 61 is thicker than 1.0 $\mu$m, a crack is more likely to be formed in the first p-type clad layer 61, so that when a next layer is formed on this cracked layer, the resultant semiconductor layer will be poor in crystallinity, thus greatly lowering the output of the resultant device. Therefore, the control of the thickness of the first p-type clad layer 61 is very important in the case of an LD device.

The second p-type clad layer 62 is formed of a p-type nitride semiconductor having a larger band gap than that of the first p-type clad layer 61, and containing Al and Ga. It is most preferably formed of a ternary mixed crystal of a p-type AlGaN, because if the second p-type clad layer is constituted by this p-type AlGaN, a p-type layer of high carrier concentration can be easily obtained. Additionally, if the second p-type clad layer 62 is constituted by this p-type AlGaN, the differences in band gap and refractive index between the second p-type clad layer 62 and the first p-type clad layer 61 can be enlarged, thus allowing the second p-type clad layer 62 to effectively function as a light confinement layer. Although there is no particular limitation on the thickness of the second p-type clad layer 62, a thickness in the range of 500 angstroms to about 1 μm is preferable in view of obtaining a p-type AlGaN layer of good crystal quality and of high carrier concentration without cracking. The p-conductivity may be obtained by doping a nitride semiconductor with an acceptor impurity such as Mg, Zn, C, Be, Ca or Ba during the step of crystal growth thereof. If a p-type layer of high carrier concentration is to be obtained, it is preferable to perform an annealing at a temperature of 400° C. or more after the doping of an acceptor impurity. When an annealing is performed in this manner, a carrier concentration of $1 \times 10^{17}/cm^3$ to $1 \times 10^{19}/cm^3$ can be usually obtained in the p-type AlGaN. Meanwhile, in the manufacture of an LED device, the second p-type clad layer 62 formed of AlGaN may be omitted.

The p-type contact layer 15 is formed of a p-type nitride semiconductor. If it is formed of a binary or ternary mixed crystal such as GaN or AlGaN, a contact layer of excellent crystallinity can be obtained. If the p-type contact layer 12 is formed of GaN in particular, an excellent ohmic contact with a positive electrode material can be achieved. As for the materials for the positive electrode 17, the use of a metallic material containing both Ni and Au is preferable.

According to the first embodiment of the present invention, the first p-type clad layer 61 formed of p-type AlGaN is formed in contact with the active layer 14, and the second p-type clad layer 62 formed of p-type AlGaN and having a larger band gap than that of the first p-type clad layer 61 is formed in contact with the first p-type clad layer 61. With this construction, it has become possible to realize a light-emitting device of high emission output with the first p-type clad layer 61 being functioned as a light-guiding layer and also as a protecting layer for the active layer 14, and the second p-type clad layer 62 being functioned as a light confinement layer.

According to a second embodiment of the present invention, there is provided a nitride semiconductor light-emitting device provided with an active layer, as in the first embodiment, interposed between an n-type nitride semiconductor layer and a p-type nitride semiconductor layer. The above mentioned n-type nitride semiconductor layer comprises, as mentioning from the active layer side, a first n-type clad layer formed of an n-type nitride semiconductor containing indium and gallium or an n-type GaN, and a second n-type clad layer formed of an n-type nitride semiconductor having a larger band-gap than that of the first n-type clad layer. The thickness of the first n-type clad layer is in the range of 10 angstroms to 1.0 μm.

Figure 2:
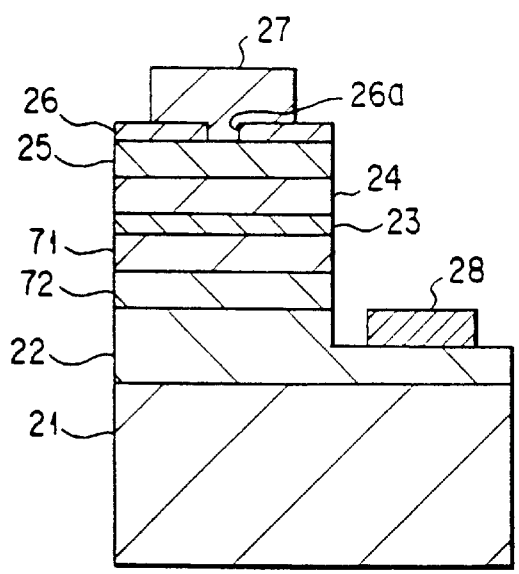
FIG. 2 is a cross-sectional view schematically illustrating a structure of a light-emitting device according to a second embodiment of the present invention.

FIG. 2 shows a cross-sectional view schematically illustrating a structure of a light-emitting device (LD structure) according to the second embodiment of the present invention. Referring to FIG. 2, the light-emitting device comprises a substrate 21 on which an n-type contact layer 22, a second n-type clad layer 72, a first n-type clad layer 71, an active layer 23, a p-type clad layer 24 and a p-type contact layer 25 are superimposed in the mentioned order. On the surface of the p-type contact layer 25, there is formed a current-contracting layer 27 formed of an insulating material and having an opening 26a formed therein. On the surface of this current-contracting layer 27 is formed a positive electrode 27 connected to the p-type contact layer 25 through the opening 25a. On the other hand, a negative electrode 28 is formed on the surface of the n-type contact layer 22. In an LED device, no current-contracting layer 27 is formed.

To the substrate 21, the n-type contact layer 22, the active layer 23 and the p-type contact layer 25, the features and explanations described in the first embodiment with respect to the substrate 11, the n-type contact layer 12, the active layer 13 and the p-type contact layer 15 can be applied, respectively.

In the second embodiment of the present invention, the second n-type clad layer 72 should be constituted by an n-type nitride semiconductor layer having a larger band gap than that of the first n-type clad layer 71, preferably a binary or ternary mixed crystal of an n-type nitride semiconductor such as GaN or AlGaN. Of these materials, most preferred is a ternary mixed crystal of n-type AlGaN, because if the second p-type clad layer is constituted by this n-type AlGaN, the differences in band gap and refractive index can be made larger than those of the active layer 23 and the first n-type clad layer 71, thus allowing this second n-type clad layer to effectively function as a light confinement layer. Although there is not any critical limitation on the thickness of this second n-type clad layer, a thickness in the range of 500 angstroms to about 1 μm may be preferable in view of obtaining an n-type AlGaN layer of high crystal quality which is free from any cracking. Meanwhile, in the manufacture of an LED device, this second n-type clad layer 72 formed of AlGaN may be omitted. If this second n-type clad layer 72 is omitted, the n-type contact layer 22 naturally takes the place of the second n-type clad layer.

The first n-type clad layer 71 contacting with the active layer 23 is formed of an n-type nitride semiconductor containing In and Ga, or an n-type GaN. The thickness of the first n-type clad layer 71 should preferably be within the range of 10 angstroms to 1 μm, more preferably 30 angstroms to 0.1 μm. With the thickness of the first n-type clad layer 71 being made larger than 10 angstroms or more, it is possible to allow the first n-type clad layer 71 to function as a buffer layer between the active layer 23 and the second n-type clad layer 71. Namely, the first n-type clad layer 71 formed of InGaN or GaN is inherently soft in nature so that it is capable of absorbing a strain due to the mismatching of lattice constants and a difference in thermal expansion coefficient between the second n-type clad layer 72 formed of AlGaN and the active layer 23. Due to the presence of this first n-type clad layer 71, all of the active layer 23, the second n-type clad layer 72 and the p-type clad layer 24 can be hardly cracked even if the thickness of the active layer 23 is made thinner. In other words, since the first n-type clad layer 71 functions as a buffer layer, the active layer can be elastically deformed even if the thickness thereof is not more than 100 angstroms, thus diminishing the crystal defect of the active layer. Owing to such an effect, the active layer retains its excellent crystal quality even if the active layer is thin, so that the emission output can be increased. Additionally, due to the thinning of the active layer, the light-emitting output can be increased according to the strain quantum well effect or exciton emission effect. If an n-type GaN is employed as a material for the first n-type clad layer 71, a somewhat inferior but almost the same effect as obtainable with the employment of InGaN can be obtained.

In order to realize an LD device, the thickness of the first n-type clad layer 71 should preferably be within the range of 100 angstroms to 1.0 µm, because the first p-type clad layer 71 can be functioned as a light-guiding layer when the thickness thereof is 100 angstroms or more. On the other hand, since the confinement of light in the active layer may become incomplete if the active layer becomes very thin as in the case of the first embodiment, the first n-type clad layer 71 is utilized as a light-guiding layer for confining the light in the light-emitting device of the present invention. Fortunately, since InGaN or GaN constituting the first n-type clad layer 71 functions as a buffer in this case, the thinning of the active layer can be made possible. It is also important to adjust the thickness of the first n-type clad layer 71 to not more than 1.0 µm. If the thickness of the first n-type clad layer 71 is larger than 1.0 µm, the color of InGaN becomes dark, thus making it very difficult to form an InGaN film of better quality. Moreover, a large number of pits will be formed in the resultant crystal, hence the production of LED or LD device of high output would become difficult, since the emission output of the device may be extremely lowered.

According to the second embodiment of the present invention, the first n-type clad layer 71 formed of n-type InGaN or n-type GaN is formed in contact with the active layer 23, and the second n-type clad layer 72 formed of n-type AlGaN and having a larger band gap than that of the first n-type clad layer 71 is formed in contact with the first n-type clad layer 71. With this construction, it has become possible in the case of an LD device to realize a light-emitting device with the first n-type clad layer 71 being functioned as a light-guiding layer and the second n-type clad layer 72 being functioned as a light confinement layer, and in the case of an LED device to realize a light-emitting device of high emission output.

According to a third embodiment of the present invention, there is provided a nitride semiconductor light-emitting device provided with an active layer, as in the first embodiment, interposed between an n-type nitride semiconductor layer and a p-type nitride semiconductor layer. The above mentioned p-type nitride semiconductor layer comprises, as mentioning from the active layer side, a first p-type clad layer formed of an p-type nitride semiconductor containing aluminum and gallium, and a second p-type clad layer formed of a p-type nitride semiconductor having a larger band-gap than that of the first p-type clad layer. The above mentioned n-type nitride semiconductor layer comprises, as mentioning from the active layer side, a first n-type clad layer formed of an n-type nitride semiconductor containing indium and gallium or an n-type GaN, and a second n-type clad layer formed of an n-type nitride semiconductor having a larger band-gap than that of the first n-type clad layer.

Figure 3:
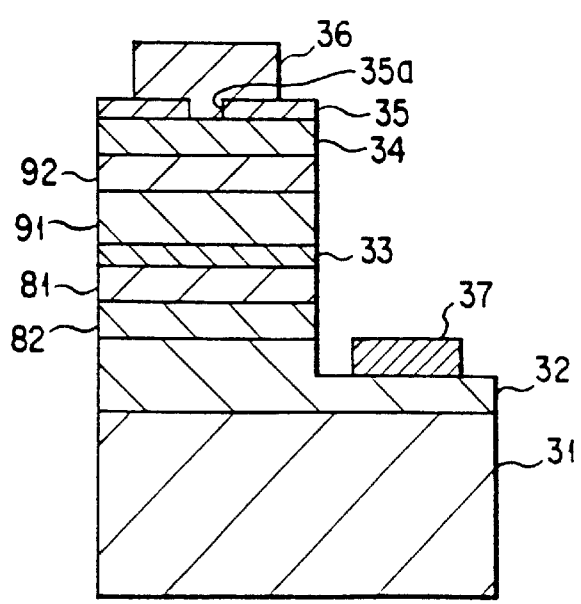
FIG. 3 is a cross-sectional view schematically illustrating a structure of a light-emitting device according to a third embodiment of the present invention.

FIG. 3 shows a cross-sectional view schematically illustrating a structure of a light-emitting device (LD structure) according to the third embodiment of the present invention. Referring to FIG. 3, the light-emitting device comprises a substrate 31 on which an n-type contact layer 32, a second n-type clad layer 82, a first n-type clad layer 81, an active layer 33, a first p-type clad layer 91, a second p-type clad layer 92 and a p-type contact layer 34 are superimposed in the mentioned order. On the surface of the p-type contact layer 34, there is formed a current-contracting layer 35 formed of an insulating material and having an opening 35a formed therein. On the surface of this current-contracting layer 35 is formed a positive electrode 36 connected to the p-type contact layer 34 through the opening 35a. On the other hand, a negative electrode 37 is formed on the surface of the n-type contact layer 32.

In this third embodiment of the present invention, the thickness of the first p-type clad layer 91 should preferably be within the range of 100 angstroms to 1.0 µm, more preferably 100 angstroms to 0.5 µm, while the thickness of the first n-type clad layer 81 should preferably be controlled to the range of 10 angstroms to 1.0 µm, more preferably 30 angstroms to 0.1 µm.

The third embodiment of the present invention represents one of the most preferable structures of a light-emitting device. When this structure is applied to the LD device, the first n-type clad layer 81 functions as a light-guiding layer; the second n-type clad layer 82, as a light confinement layer; the first p-type clad layer 91, as a light-guiding layer; and the second n-type clad layer 82, as a light confinement layer.

To the substrate 31, the n-type contact layer 32, the second n-type clad layer 82, the first n-type clad layer 81, the active layer 33, the first p-type clad layer 91, the second p-type clad layer 92 and the p-type contact layer 34 in the third embodiment, the features and explanations described with reference to the first and second embodiments can most preferably be applied. For example, the n-type contact layer 32 should most preferably be formed of n-type GaN; the second n-type clad layer 82, formed of n-type AlGaN; the first n-type clad layer 81, formed of n-type InGaN; the active layer 33, formed of non-doped InGaN; the first p-type clad layer 91, formed of p-type AlGaN; the second p-type clad layer 92, formed of p-type AlGaN; and the p-type contact layer 34, formed of p-type GaN.

According to a fourth embodiment of the present invention, there is provided a nitride semiconductor light-emitting device provided with an active layer, as in the first embodiment, interposed between an n-type nitride semiconductor layer and a p-type nitride semiconductor layer. The above mentioned p-type nitride semiconductor layer comprises a first p-type clad layer formed of an p-type nitride semiconductor containing aluminum and gallium, and contacted with the active layer, the thickness of the first p-type clad layer being in the range of 10 angstroms to 1.0 µm.

The construction of the light-emitting device according to the fourth embodiment is not shown in the drawing, but is fundamentally the same as shown in FIG. 1, i.e., the materials and thicknesses of the substrate, the n- and p-type contact layers, the active layer, and the n- and p-type clad layers are the substantially the same as those described with reference to FIG. 1. Main feature of this fourth embodiment resides in that the first p-type clad layer 61 shown in FIG. 1 has a thickness within the range of 10 angstroms to 1.0 µm. According to this fourth embodiment, either the n-type contact layer 12 or the n-type clad layer 13 shown in FIG. 1 may be omitted, and further either the second p-type clad layer 62 or the p-type contact layer 15, or both of them may be omitted.

As mentioned above, the n-type clad layer contacting with the active layer in the fourth embodiment is preferably formed of an n-type nitride semiconductor containing In and Ga, particularly InGaN or of an n-type GaN. Because the n-type clad layer formed of InGaN functions as a buffer layer, absorbing a strain due to a mismatching of lattice constant and a difference in thermal expansion coefficient between the clad layer and the active layer, so that even if the thickness of the active layer is made thinner, the formation of crack in the active layer can be avoided, thus retaining its excellent crystal quality thereby increasing the emission output. Additionally, due to the thinning of the active layer, the light-emitting output can be increased according to the strain quantum well effect or exciton emission effect.

Main feature of this fourth embodiment of the present invention resides in the thickness of the first p-type clad layer, which is within the range of from 10 angstroms to 1.0 µm. It is most important that when the active layer is of an SQW or MQW structure, the first p-type clad layer contacting with this active layer is formed of p-type AlGaN and has thickness of 1 µm or less. If the thickness of the first p-type clad layer is larger than 1 µm, cracks may be formed in the first p-type clad layer, thus making it unsuited for use as a light-emitting device. On the other hand, if the thickness of the first p-type clad layer is smaller than 10 angstroms, the active layer is more likely to be decomposed as mentioned above, thereby lowering the light-emitting output.

Unexamined Japanese Patent Application Publication (Kokai) 6-21511 discloses a light-emitting device which is similar in structure to the light-emitting device of the fourth embodiment. However, this Japanese Patent Unexamined Publication differs in the thickness of the first p-type clad layer from the present invention. Namely, according to this Publication, the p-type clad layer consisting of GaN or AlGaN is grown in an active layer to a thickness of as large as 2 µm. Whereas, according to the present invention, the p-type clad layer is formed exclusively of AlGaN and the thickness thereof is 1 µm or less. As explained with reference to the first embodiment, AlGaN can be more easily turned into p-type as compared with other nitride semiconductor such as GaN, InGaN and InAlGaN, so that AlGaN can be formed into a p-type layer having the highest hole carrier concentration among these nitride semiconductors. Therefore, when a p-type AlGaN is formed into a p-type clad layer, a light-emitting device of very high emission output can be obtained. If this AlGaN is formed into a thick layer of as large as 2 µm, the layer can be hardly turned into p-type, and at the same time, due to the inherent nature of the AlGaN crystal, a crack may be formed in the resultant crystal during the growth thereof to such a thickness. Therefore, the light-emitting device disclosed in the above-mentioned Unexamined Japanese Patent Application Publication may be either hardly to emit light or difficult to produce. By contrast, according to the fourth embodiment of the present invention, the kind of p-type clad layer and thickness thereof that will be formed on a thin active layer are definitely determined, thus succeeding to produce a nitride semiconductor light-emitting device of practical structure.

Figure 4:
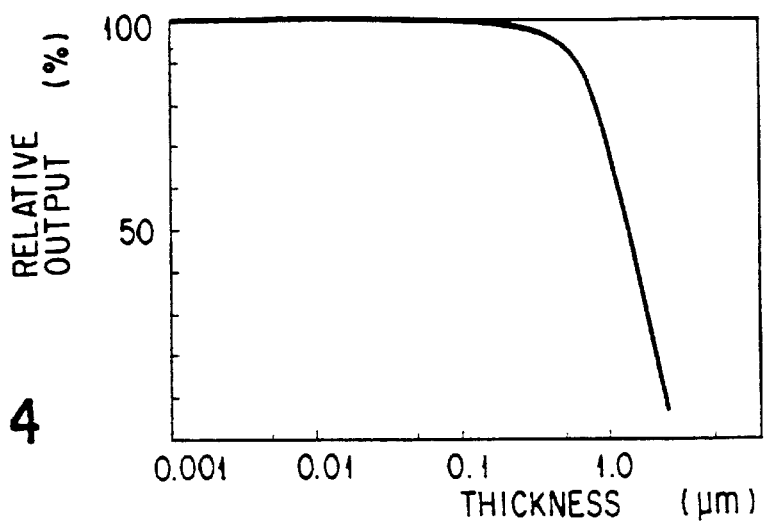
FIG. 4 is a graph showing a relationship between the thickness of a first p-type clad layer and the emission output according to a first embodiment of the present invention.

FIG. 4 is a graph showing the changes in emission output relative to the thickness of the first p-type clad layer 61 of the light-emitting device similar to that shown in FIG. 1. Specifically, the relative emission output shown in FIG. 4 is of an LED device comprising an n-type contact layer (GaN) 12 having a thickness of 4 µm, an n-type clad layer (InGaN) 13 having a thickness of 500 angstroms, an active layer (InGaN) 14 having a thickness of 20 angstroms (a single-quantum well structure), a first p-type clad layer (AlGaN) 61 and a second p-type clad layer (AlGaN) 62, each having a thickness of 0.1 µm, and a p-type contact layer (GaN) 15 having a thickness of 1 µm. Namely, the electrode 17 is formed directly on the p-type contact layer 15.

As seen from FIG. 4, when the thickness of the first p-type clad layer 61 exceeds 1 µm, the emission output tends to be abruptly decreased. This can be ascribed to the deterioration in crystallinity of the device due to the formation of cracks in the first p-type clad layer 61. It will be also apparent from FIG. 4 that the thickness of the first p-type clad layer 61 in the case of LED should preferably be in the range of 10 angstroms (0.001 µm) to 1 µm. In the case of an LD device shown in the first and third embodiments, however, the thickness of the first p-type clad layer should preferably be 100 angstroms or more, since the first p-type clad layer is less likely to function as a light-guiding layer if the thickness thereof becomes less than 100 angstroms.

Figure 5:
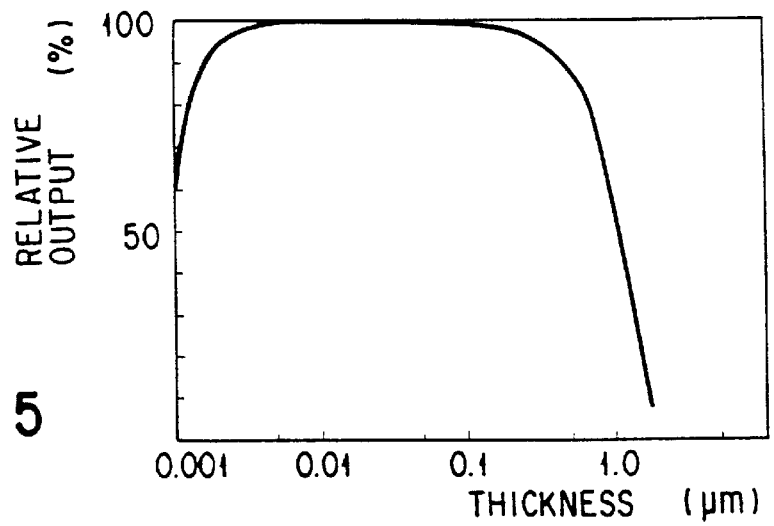
FIG. 5 is a graph showing a relationship between the thickness of a first n-type clad layer and the emission output according to a second embodiment of the present invention.

FIG. 5 shows a graph showing the changes in emission output relative to the thickness of the first n-type clad layer 71 of the light-emitting device similar to that shown in FIG. 2. Specifically, the relative emission output shown in FIG. 5 is of a LED device comprising an n-type contact layer (GaN) 22 having a thickness of 4 µm, an n-type clad layer (AlGaN) 72 having a thickness of 0.1 µm, a first n-type clad layer (InGaN) 71 having a thickness of 20 angstroms, an active layer (InGaN) 23 having a thickness of 20 angstroms (a single-quantum well structure), a p-type clad layer (AlGaN) 24 having a thickness of 0.1 µm, a p-type contact layer (GaN) 25 having a thickness of 1 µm. Namely, the p-electrode 27 is formed directly on the p-type contact layer 25.

As seen from FIG. 5, when the thickness of the first n-type clad layer 71 exceeds 1 µm, the emission output tends to be abruptly decreased. This can be ascribed to the deterioration in crystallinity of the device, e.g., a darkening of the crystal or the generation of pits in the crystal. On the contrary, if the thickness of the first n-type clad layer 71 is less than 30 angstroms, the emission output of the emission device tends to decrease. This indicates that a preferable thickness of the first n-type clad layer 71 is 30 angstroms or more, with which the first n-type clad layer 71 formed of InGaN effectively functions as a buffer layer. Meanwhile, if the thickness of the first n-type clad layer 71 is less than 10 angstroms, it no more functions as a buffer layer, causing the generation of a large number of cracks in the active layer 23 and the clad layers 72 and 24, thus making it very difficult to manufacture the device, and at the same time greatly deteriorating the emission output. Therefore, the first n-type clad layer 71 in the second embodiment of the present invention should preferably have a thickness within the range of 10 angstroms to 1 µm, more preferably from 30 angstroms to 0.1 µm.

Figure 6:
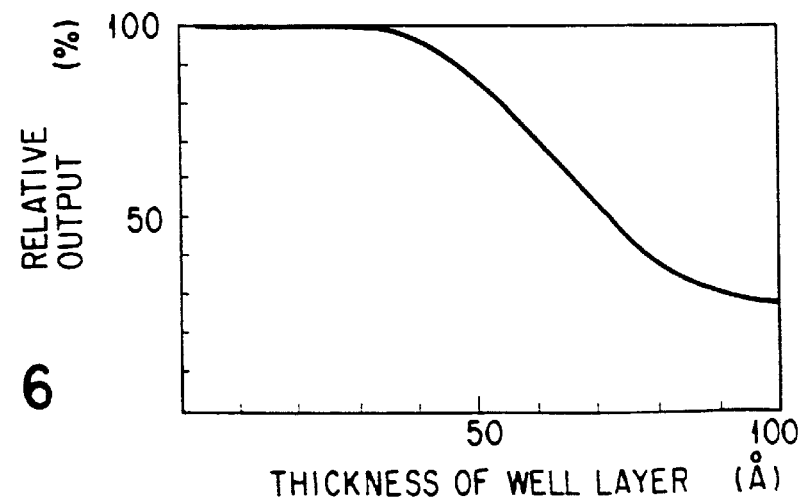
FIG. 6 is a graph showing a relationship between the thickness of a well layer and the emission output.
Figure 7:
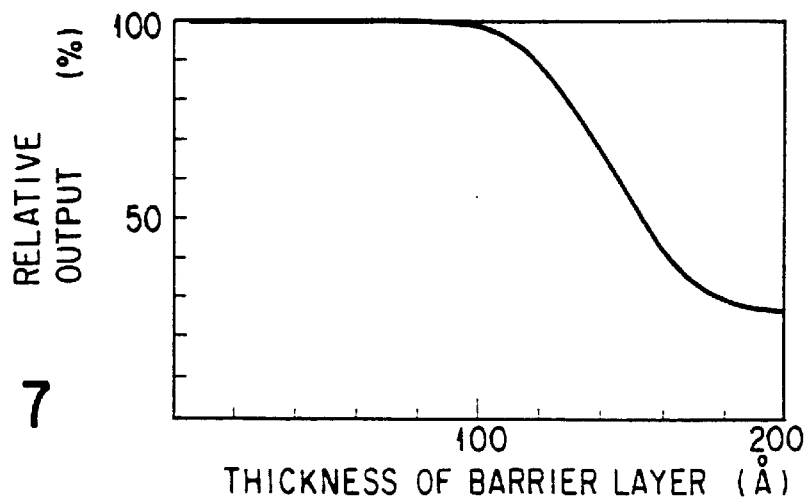
FIG. 7 is a graph showing a relationship between the thickness of a barrier layer and the emission output.
Figure 8:
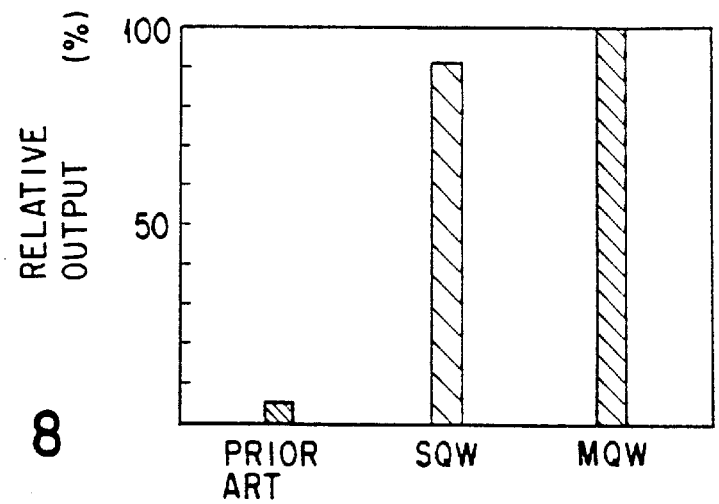
FIG. 8 is a graph showing the output of a light-emitting device of the present invention in comparison with that of the conventional light-emitting device.

FIGS. 6 and 7 respectively illustrates the relationship between the thickness of the well layer or of the barrier layer and the relative emission output of the light-emitting device according to the present invention whose active layer is of a quantum well structure. As seen from these Figures, the thickness of the well layer should preferably be 70 angstroms or less, more preferably 50 angstroms or less, while the thickness of the barrier layer should preferably be 150 angstroms or less, more preferably 100 angstroms or less.

A nitride semiconductor light-emitting device according to a fifth embodiment of the present invention comprises an active layer which is similar in feature to the first embodiment mentioned above and has a first main surface and a second main surface. A first n-type clad layer formed of an n-type nitride semiconductor containing indium and gallium is formed in contact with the first main surface of the active layer.

A nitride semiconductor light-emitting device according to a sixth embodiment of the present invention comprises an active layer which is similar in feature to the first embodiment mentioned above and has a first main surface and a second main surface. A first p-type clad layer formed of a p-type nitride semiconductor containing indium and gallium is formed in contact with the second main surface of the active layer.

Figure 9:
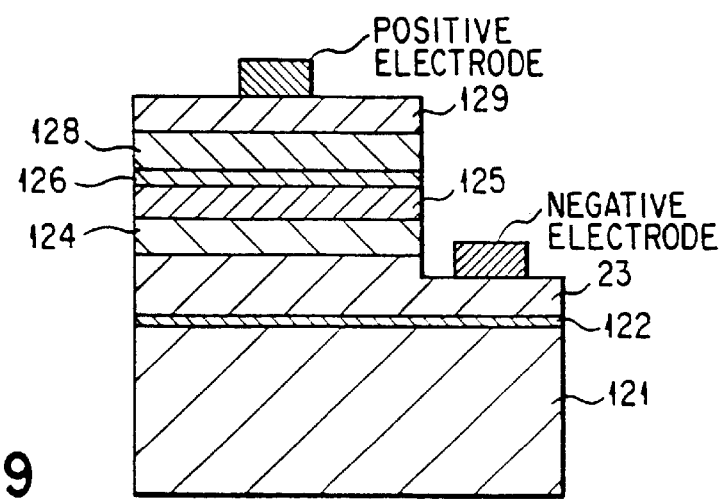
FIG. 9 is a cross-sectional view schematically illustrating a structure of a light-emitting device according to a fifth embodiment of the present invention.
Figure 10:
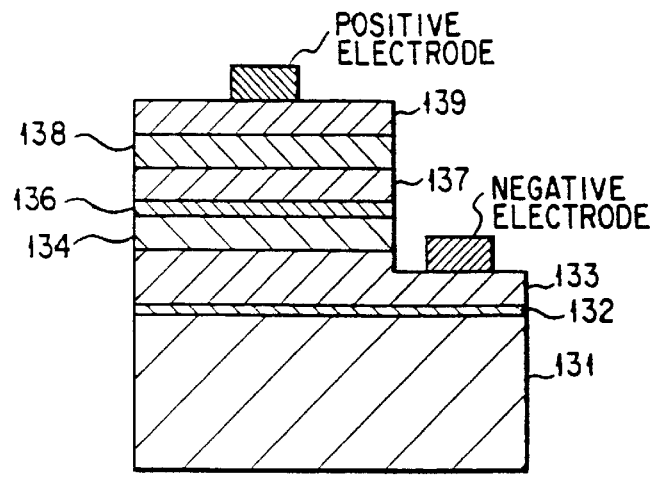
FIG. 10 is a cross-sectional view schematically illustrating a structure of a light-emitting device according to a sixth embodiment of the present invention.

FIG. 9 shows a cross-sectional view schematically illustrating a structure of a light-emitting device according to the fifth embodiment of the present invention; and FIG. 10 shows a cross-sectional view schematically illustrating a structure of a light-emitting device according to the sixth embodiment of the present invention. The fifth and sixth embodiments of the present invention will be explained below with reference to these Figures.

The light-emitting device shown in FIG. 9 comprises a substrate 121 on which a buffer layer 122 for alleviating a lattice mismatching between the substrate 121 and the nitride semiconductor, an n-type contact layer 123 for forming a negative electrode thereon, a second n-type clad layer 124, a first n-type clad layer 125, an active layer 126, a second p-type clad layer 128 and a p-type contact layer 129 for forming a positive electrode thereon are superimposed in the mentioned order.

The light-emitting device shown in FIG. 10 comprises a substrate 131 on which a buffer layer 132 for alleviating a lattice mismatching between the substrate 131 and the nitride semiconductor, an n-type contact layer 133 for forming a negative electrode thereon, a second n-type clad layer 134, an active layer 136, a first p-type clad layer 137, a second p-type clad layer 138 and a p-type contact layer 139 for forming a positive electrode thereon are superimposed in the mentioned order.

In these fifth and sixth embodiments, the active layers 126 and 136 may be of a single-quantum well structure formed of InGaN, whose indium content can be changed depending on a desired band gap. Alternatively, the active layers 126 and 136 may be a laminate consisting of a combination of thin films, each differing in composition, such as InGaN/GaN or InGaN/InGaN (different in composition from the former) thereby to form a multi-quantum well structure. The active layer may be n-type or p-type in any of single-quantum well and multi-quantum well structures. However, when the active layer of the quantum well structure is a non-doped layer, a band-to-band emission of narrow half band width, an exciton emission or a inter-quantum well level emission may be obtained, which is preferable in view of realizing a light-emitting diode device or a laser diode. Alternatively, the active layers 126 and 136 may be doped with a donor impurity and/or an acceptor impurity. If the crystallinity of an active layer doped with an impurity can be controlled to the same quality as that of non-doped active layer, it is possible, through the doping with a donor impurity, to further increase the band-to-band light-emitting intensity as compared with the non-doped active layer. It is possible, through the doping with an acceptor impurity, to shift a peak wavelength toward the lower energy side by a magnitude of about 0.5 eV from the peak wavelength of the band-to-band emission, but the half band width will be enlarged in such a case. If doping with both acceptor impurity and donor impurity is performed on an active layer, the light-emitting intensity of the active layer will be further intensified as compared with an active layer doped only with an acceptor impurity. If an active layer doped with an acceptor impurity is to be formed, the conductivity type of the active layer should preferably be turned into n-type by doping it with a donor impurity such as Si together with the doping of the acceptor impurity. However, since the active layer should ideally emit a strong light through a band-to-band emission according to the present invention, the employment of a non-doped InGaN as material for the active layer is most desirable. Speaking in other way, if an active layer is doped with an impurity, the crystallinity of the resultant layer is more likely to be deteriorated as compared with a non-doped active layer. Moreover, a light-emitting device where a non-doped InGaN is employed as an active layer is advantageous in lowering Vf (forward voltage) value as compared with a light-emitting device doped with an impurity. The thickness of each of the well layer and the barrier layer in an active layer of the quantum well structure may be the same as that explained with reference to the first embodiment.

The first n-type clad layer 125 contacting with the active layer 126 of the light-emitting device having the structure shown in FIG. 9 (the fifth embodiment) should desirably be constituted by an n-type $In_xGa_{1-x}N$ ($0<x<1$). The value of "x" may be controlled to the range of preferably $0<x\leqq0.5$, more preferably $0<x\leqq0.3$, most preferably $0<x\leqq0.2$. The carrier concentration of this first n-type clad layer 125 should desirably be within the range of $1\times10^{18}/cm^3$ to $1\times10^{20}/cm^3$. Generally, as the molar ratio of In in InGaN is increased, the crystallinity of the compound tends to become more deteriorated. Therefore, in order to obtain an InGaN layer exhibiting a high emission output in practical use, it is preferable to grow an $In_xGa_{1-x}N$ where "x" value is 0.5 or less. If the carrier concentration is less than $1\times10^{18}/cm^3$, an electron injection efficiency of carrier into the InGaN active layer would be lowered, thus lowering the light-emitting output. On the other hand, if the carrier concentration is higher than $1\times10^{20}/cm^3$, the crystallinity of the first n-type clad layer becomes deteriorated, thus possibly lowering the light-emitting output.

The first p-type clad layer 137 contacting with the active layer 136 of the light-emitting device having the structure shown in FIG. 10 (the sixth embodiment) should desirably be constituted by a p-type $In_yGa_{1-y}N$ ($0\leqq y\leqq 1$). The value of "y" may be controlled to the range of preferably $0\leqq y\leqq 0.5$, more preferably $0\leqq y\leqq 0.3$, most preferably $0\leqq y\leqq 0.2$. The carrier concentration of this first p-type clad layer 137 should desirably be controlled within the range of $1\times10^{17}/cm^3$ to $1\times10^{19}/cm^3$. The reason for limiting the value "y" to not more than 0.5 is the same for limiting the value "x" to not more than 0.5. If the carrier concentration is less than $1\times10^{17}/cm^3$, a positive hole injection efficiency of carrier into the InGaN active layer would be lowered, thus lowering the light-emitting output. On the other hand, if the carrier concentration is higher than $1\times10^{19}/cm^3$, the crystallinity of the first p-type clad layer becomes deteriorated, thus possibly lowering the light-emitting output.

In the conventional nitride semiconductor light-emitting device where an active layer mainly consisted of InGaN is interposed between a couple of clad layers mainly consisting of AlGaN respectively, with the decrease in thickness of the active layer, cracks are more likely to be generated in the InGaN active layer and the AlGaN clad layer. For example, when the thickness of the Active layer is decreased to less than 200 angstroms, a large number of cracks are inevitably formed in the active layer and the clad layer, thus making it difficult to manufacture a light-emitting device. This implies that since the clad layers are inherently very hard in physical nature, it is impossible for the thin InGaN active layer to elastically alleviate an mismatching of the lattices at the interface as well as a difference in thermal expansion coefficient between the active layer and the AlGaN clad layer. Because of this cracking in the clad layer and in the active layer, it has been impossible to make the active layer thinner.

Meanwhile, according to the fifth and sixth embodiments of the present invention, the first n-type clad layer 125 and the first p-type clad layer 137 both containing In and Ga are additionally formed, each in contact with the active layers 126 and 136 containing In and Ga, respectively, as shown in FIGS. 9 and 10. These first n-type clad layer 125 and first p-type clad layer 137 are disposed to function as a buffer layer between the active layer and the second n-type clad layer 124, or between the active layer and the second p-type clad layer 138, respectively. Namely, since the first clad layers 125 and 137 containing In and Ga are inherently soft in crystal nature, the first clad layers 125 and 137 are capable of absorbing any strain to be generated due to the mismatching of the lattice constants as well as due to a difference in thermal expansion coefficient between the second clad layers 124 and 138 containing Al and Ga and the active layers 126 and 136. Accordingly, even if the active layer is made thin in thickness, there is no possibility of crack being introduced into the active layers 126 and 136 as well as into the second clad layers 124 and 138. Due to the absorption of strain by the first clad layers 125 and 137, the active layer can be elastically deformed to minimize the crystal defect thereof even if the active layer is sufficiently made thin to realize a single-quantum well or a multi-quantum well structure. Accordingly, even if the active layer is made thin, the crystallinity of the active layer can be excellently retained so as to make it possible to increase the emission output. Furthermore, due to the thinning of the active layer, it is possible to bring about the quantum effect as well as the exciton effect thereby increasing the light-emitting output of the light-emitting device. According to the conventional light-emitting device, it is required to make the thickness of the active layer as large as 1,000 angstroms or more in order to prevent a crack from being formed in the clad layer as well as in the active layer. However, since the active layer is always applied with strain due to a difference in thermal expansion coefficient and due to the mismatching of lattice constant, and since the thickness of the active layer of the conventional light-emitting device exceeds the critical thickness enabling an elastic deformation of the active layer as mentioned above, the conventional active layer could not be elastically deformed, thus causing a large number of crystal defects in the active layer and making it impossible to emit a sufficient band-to-band emission.

Next, the effects of the thickness in total of the first n-type clad layer 125 and the active layer 126, and of the thickness in total of the active layer 136 and the first p-type clad layer 137 will be explained. It is desired that the thickness in total of the first n-type clad layer 125 and the active layer 126, and of the thickness in total of the active layer 136 and the first p-type clad layer 137 should preferably be controlled to 300 angstroms or more. In other words, a total thickness including the active layer containing In and Ga, and the first clad layer containing In and Ga should preferably be controlled to 300 angstroms or more. Because, if the thickness of nitride semiconductor layers containing In and Ga (the active layer+the first clad layer) is less than 300 angstroms, cracks may possibly be formed in the active layer as well as in the first and second clad layers. The cause of this cracking can be ascribed to the fact that strain stresses due to mismatching of lattice constants or due to a difference in thermal expansion coefficient mentioned above are acting on the interface between the second n-type clad layer 124 containing Al and Ga and the active layer 126, or between the second p-type clad layer 138 containing Al and Ga and the active layer 136. Whereas, when the first clad layer functioning as a buffer layer is interposed between the second clad layer containing Al and Ga, and the active layer containing In and Ga, these strain stresses are alleviated, inhibiting the formation of crack in the active layer and the first and second clad layers. Accordingly, in view of alleviating these strain stresses, a nitride semiconductor layer containing In and Ga and formed of a soft crystal should preferably be grown to a thickness of 300 angstroms or more. For example, in the case of the fifth embodiment, when the first n-type clad layer 125 is formed to a thickness of not less than several angstroms, cracks can hardly be formed in the active layer and the clad layers even if the active layer 126 is formed to a thickness of 300 angstroms. Alternatively, the first n-type clad layer 125 may be 300 angstrom thick, while the active layer 126 may be several angstroms in thickness. However, in the case of the fifth embodiment, since the active layer can be easily made thinner if the thickness of the first n-type clad layer 125 is relatively large, the first n-type clad layer 125 should preferably be formed to have a relatively large thickness.

In the fifth embodiment of the present invention, the second n-type clad layer 124 should desirably be constituted by an n-type $Al_aGa_{1-a}N$ ($0 \leq a < 1$). The value of "a" may be controlled to the range of preferably $0 \leq a \leq 0.6$, most preferably $0 \leq a \leq 0.4$. Because the crystal of AlGaN is relatively hard, so that if "a" is more than 0.6, the possibility of generating a crack in the AlGaN itself would be abruptly increased. The carrier concentration of this second n-type clad layer 124 should desirably be controlled within the range of $5 \times 10^{17}/cm^3$ to $1 \times 10^{19}/cm^3$. If the carrier concentration is less than $5 \times 10^{17}/cm^3$, the resistivity of AlGaN will be increased, thus making the Vf of the light-emitting device higher, possibly lowering the light-emitting efficiency. On the other hand, if the carrier concentration is higher than $1 \times 10^{19}/cm^3$, the crystallinity of the first p-type clad layer becomes deteriorated, thus possibly lowering the light-emitting efficiency. The thickness of the second clad layer 124 may be in the range of 50 angstroms to 1.0 $\mu$m.

In the sixth embodiment of the present invention, the second p-type clad layer 138 should desirably be constituted by a p-type $Al_bGa_{1-b}N$ ($0 \leq b < 1$). The value of "b" may be controlled to the range of preferably $0 \leq b \leq 0.6$, most preferably $0 \leq b \leq 0.4$. The reason for limiting the range of "b" is the same as explained with regard to the second n-type clad layer 124. The carrier concentration of this second p-type clad layer 138 should desirably be controlled within the range of $1 \times 10^{17}/cm^3$ to $1 \times 10^{19}/cm^3$. If the carrier concentration is less than $1 \times 10^{17}/cm^3$, a positive hole injection efficiency of carrier into the active layer would be lowered, thus lowering the light-emitting output. On the other hand, if the carrier concentration is higher than $1 \times 10^{19}/cm^3$, the crystallinity of the AlGaN becomes deteriorated, thus possibly lowering the light-emitting output. The thickness of this second clad layer 138 may be formed in the range of 50 angstroms to 1.0 $\mu$m. With the employment of a nitride semiconductor layer having Al and Ga for the formations of the second n-type clad layer 134 and the second p-type clad layer 138, the band offset thereof in relative to the active layer 136, the first n-type clad layer 135 and the first p-type clad layer 137 can be enlarged to increase the light-emitting efficiency.

According to the fifth embodiment of the present invention, an n-type contact layer 123 formed of an n-type GaN can be formed in contact with the first n-type clad layer 125 or with the second n-type clad layer 124. This n-type GaN is suited for obtaining a most preferable ohmic contact with a negative electrode, thus lowering the Vf of a light-emitting device. Moreover, since the crystallinity thereof is more excellent as compared with other nitride semiconductor of ternary or quaternary mixed crystal, the crystallinities of the first n-type clad layer 125 and the second n-type clad layer which are to be grown on this n-type GaN will be improved, thus improving the output of the resultant light-emitting device. Examples of electrode material which enables an excellent ohmic contact with the n-type contact layer 123 are metallic materials containing Ti and Al, which may be an alloy or a laminate, i.e., a stacked Ti and Al layers. When such a metallic material is employed with Ti being disposed to contact with the n-type GaN, a very preferable ohmic contact can be realized. The carrier concentration of this n-type contact layer 123 should desirably be within the range of $5\times10^{17}/cm^3$ to $5\times10^{19}/cm^3$. If the carrier concentration is less than $5\times10^{17}/cm^3$, the formation of ohmic contact with an electrode would become difficult, thus possibly making the Vf of the light-emitting device higher. On the other hand, if the carrier concentration is higher than $5\times10^{19}/cm^3$, the crystallinities of the n-type GaN as well as other nitride semiconductor layers become deteriorated, thus possibly lowering the light-emitting efficiency.

According to the sixth embodiment of the present invention, a p-type contact layer 139 formed of a p-type GaN can be formed in contact with the first p-type clad layer 137 or with the second p-type clad layer 138. This p-type GaN is suited for obtaining a most preferable ohmic contact with a positive electrode, thus lowering the Vf of a light-emitting device. Examples of electrode material which enables an excellent ohmic contact with the p-type contact layer 139 are metallic materials containing Ni and Au. When such a metallic material is employed with Ni being disposed to contact with the p-type GaN, a very preferable ohmic contact will be realized. The carrier concentration of this p-type contact layer 139 should desirably be controlled within the range of $1\times10^{17}/cm^3$ to $1\times10^{19}/cm^3$. If the carrier concentration is less than $1\times10^{17}/cm^3$, the formation of ohmic contact with an electrode would become difficult. On the other hand, if the carrier concentration is higher than $1\times10^{19}/cm^3$, the crystallinities of the p-type GaN itself would become deteriorated, thus possibly lowering the light-emitting efficiency.

A nitride semiconductor light-emitting device according to a seventh embodiment of the present invention comprises an active layer which is similar in feature to the first embodiment mentioned above and has a first main surface and a second main surface. A first n-type clad layer formed of an n-type nitride semiconductor not containing aluminum is formed in contact with the first main surface of the active layer. A second p-type clad layer formed of a p-type nitride semiconductor containing Al and Ga is provided in contact with the second main surface of the active layer.

Figure 11:
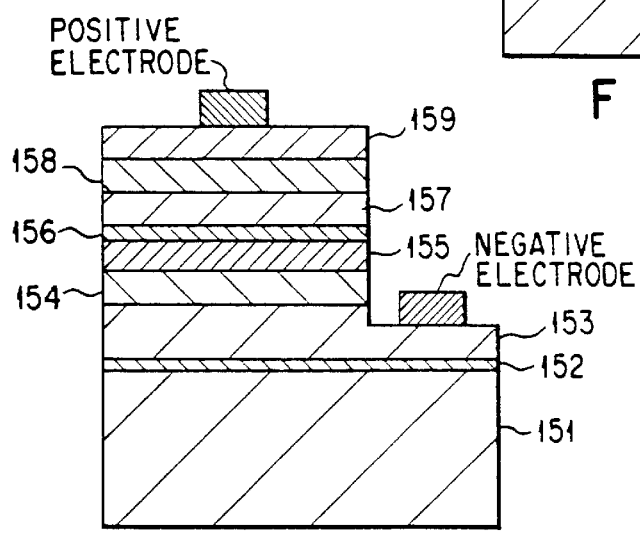
FIG. 11 is a cross-sectional view schematically illustrating a structure of a light-emitting device according to a seventh embodiment of the present invention.

FIG. 11 shows a cross-sectional view schematically illustrating a structure of a light-emitting device according to the seventh embodiment of the present invention. The light-emitting device shown in FIG. 11 comprises a substrate 151 on which a buffer layer 152 for alleviating a lattice mismatching between the substrate 151 and the nitride semiconductor, an n-type contact layer 153 for forming a negative electrode thereon, a second n-type clad layer 154, a first n-type clad layer 155, an active layer 156, a second p-type clad layer 158 and a p-type contact layer 159 for forming a positive electrode thereon are superimposed in the mentioned order.

In this seventh embodiment, the first n-type clad layer 155 formed on the first main surface of the active layer 156 is not required to be an n-type nitride semiconductor containing indium and gallium as in the case of the fifth embodiment, but may be an n-type nitride semiconductor not containing aluminum. Namely, in a specific embodiment where the fifth and sixth embodiments of the present invention are combined, GaN can be employed as the first n-type clad layer 155. Specifically, this first n-type clad layer 155 should desirably be constituted by an n-type $In_xGa_{1-x}N$ ($0\leq x<1$). Preferably, the value of "x" may be within the range of $0\leq x\leq0.5$, more preferably $0\leq x\leq0.3$, most preferably $0\leq x\leq0.2$. The carrier concentration of this first n-type clad layer 155 should desirably be controlled within the range of $1\times10^{18}/cm^3$ to $1\times10^{20}/cm^3$. Because, if "x" value is selected to 0.5 or less in the $In_xGa_{1-x}N$ for the preparation of the first clad layer, a light-emitting layer exhibiting a high emission output in practical use can be obtained. If the carrier concentration is less than $1\times10^{18}/cm^3$, an injection efficiency of electron into the InGaN active layer would be lowered, thus lowering the light-emitting output. On the other hand, if the carrier concentration is higher than $1\times10^{20}/cm^3$, the crystallinity of the first n-type clad layer becomes deteriorated, thus possibly lowering the light-emitting output.

The second p-type clad layer 158 (in FIG. 11, a first p-type clad layer 157 is interposed) contacting with the second main surface of the active layer 156 is formed of a p-type nitride semiconductor containing aluminum and gallium. Specifically, the second p-type clad layer 158 should desirably be constituted by a p-type $Al_bGa_{1-b}N$ ($0\leq b<1$). Preferably, the value of "b" may be controlled to the range of $0\leq b\leq0.6$, most preferably $0\leq b\leq0.4$. When the range of "b" is controlled to 0.6 or less, an AlGaN crystal free from crack can be obtained thus improving the crystallinity thereof, hence the light-emitting output would be improved. The carrier concentration of this second p-type clad layer 158 should desirably be controlled within the range of $1\times10^{17}/cm^3$ to $1\times10^{19}/cm^3$. If the carrier concentration is less than $1\times10^{17}/cm^3$, a positive hole injection efficiency of carrier into the active layer would be lowered, thus lowering the light-emitting output. On the other hand, if the carrier concentration is higher than $1\times10^{19}/cm^3$, the crystallinity of the AlGaN becomes deteriorated, thus possibly lowering the light-emitting output. The thickness of this second clad layer 138 may be formed in the range of 50 angstroms to 1.0 μm. With the employment of a nitride semiconductor having Al and Ga for the formations of the second p-type clad layer 158, the band offset thereof in relative to the active layer 156 and the first n-type clad layer 155 can be enlarged, thus increasing the light-emitting efficiency.

The features of the active layer 156 may be the same as those explained in the first, fifth and sixth embodiments.

According to the seventh embodiment of the present invention, a first p-type clad layer 157 formed of a p-type nitride semiconductor not containing aluminum may be interposed between the active layer 156 and the second p-type clad layer 158 as shown in FIG. 11. Specifically, this first p-type clad layer 157 should desirably be constituted by a p-type $In_yGa_{1-y}N$ ($0\leq y<1$). Preferably, the value of "y" may be within the range of $0\leq y\leq0.5$, more preferably $0\leq y\leq0.3$, most preferably $0\leq y\leq0.2$. As a material for this first p-type clad layer 157, GaN may also be employed without badly affecting the effect thereof as a buffer layer. The carrier concentration of this first p-type clad layer 157 should desirably be controlled within the range of $1\times10^{17}/cm^3$ to $1\times10^{19}/cm^3$. The reason for limiting the carrier concentration is the same as explained with reference to the first p-type clad layer 137.

It is desired that the thickness in total of the first n-type clad layer 155 and the active layer 156, or the thickness in total of the active layer 156, the first n-type clad layer 155 and the first p-type clad layer 157 should preferably be controlled to 300 angstroms or more. The reason for limiting the total thickness in this way is the same as explained above, i.e. if the total thickness is 300 angstroms or more, any strain on the clad layer and the active layer may be alleviated thereby avoiding the formation of crack in the clad layer and the active layer.

According to the seventh embodiment of the present invention, a second n-type clad layer 154 formed of an n-type nitride semiconductor containing aluminum and gallium can be disposed in contact with the first n-type clad layer 155. This second n-type clad layer 154 should desirably be constituted by an n-type $Al_aGa_{1-a}N$ ($0 \leq a < 1$). Preferably, the value of "a" may be controlled to the range of $0 \leq a \leq 0.6$, most preferably $0 \leq a \leq 0.4$. Because if "a" is controlled to not more than 0.6, the possibility of generating a crack in the AlGaN itself would be inhibited. The carrier concentration of this second n-type clad layer 154 should desirably be controlled within the range of $5 \times 10^{17}/cm^3$ to $1 \times 10^{19}/cm^3$. If the carrier concentration is less than $5 \times 10^{17}/cm^3$, an injection efficiency of electron into the active layer 156 would be lowered, thus lowering the light-emitting output. On the other hand, if the carrier concentration is higher than $1 \times 10^{19}/cm^3$, the crystallinity of the AlGaN becomes deteriorated, thus possibly lowering the light-emitting output. The thickness of the second clad layer 154 may be in the range of 50 angstroms to 1.0 μm. With the employment of a nitride semiconductor layer having Al and Ga for the formations of the second n-type clad layer 154, the band offset thereof in relative to the active layer 156 and the first n-type clad layer 155 can be enlarged, thus increasing the light-emitting efficiency.

According to the seventh embodiment of the present invention, an n-type contact layer 153 formed of an n-type GaN may be disposed in contact with the first n-type clad layer 155 or with a second n-type clad layer 154, and, at the same time or alternatively, a p-type contact layer 159 formed of a p-type GaN may be disposed in contact with the second p-type clad layer 158. The carrier concentration of this n-type contact layer 153 should desirably be controlled within the range of $5 \times 10^{17}/cm^3$ to $5 \times 10^{19}/cm^3$. On the other hand, the carrier concentration of the p-type contact layer 159 should desirably be controlled within the range of $1 \times 10^{17}/cm^3$ to $1 \times 10^{19}/cm^3$. The reason for selecting GaN as a material for the contact layers is the same as explained above, i.e. an excellent ohmic contact with an electrode material will be realized, and at the same time, in the case of the n-type contact layer 153, the crystallinity of nitride semiconductor to be grown thereon will be improved particularly. By the same reason as explained above, the carrier concentration of the n-type contact layer 153 should desirably be controlled within the range of $5 \times 10^{17}/cm^3$ to $5 \times 10^{19}/cm^3$, and the carrier concentration of the p-type contact layer 159 should desirably be controlled within the range of $1 \times 10^{17}/cm^3$ to $1 \times 10^{19}/cm^3$.

According to the seventh embodiment of the present invention, it is also possible to dispose as a light-reflecting film a first multi-layered film 100 consisting of at least two kinds of nitride semiconductor layers, each differing in composition on the outer side of the first n-type clad layer 155, and/or a second multi-layered film 200 consisting of at least two kinds of nitride semiconductor layers, each differing in composition on the outer side of the second p-type clad layer 158.

Figure 12:
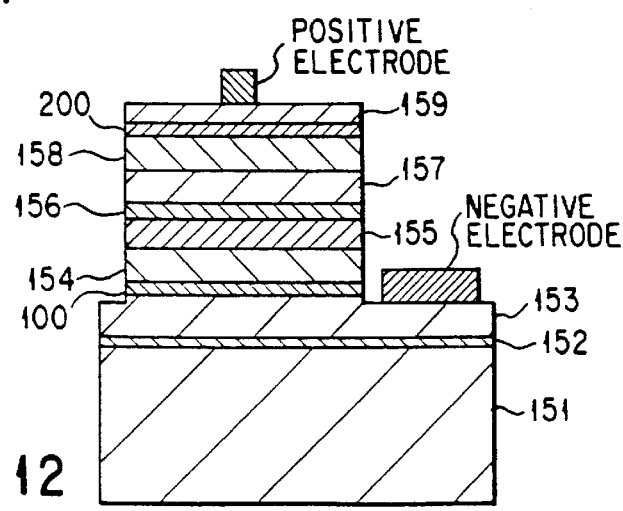
FIG. 12 is a cross-sectional view schematically illustrating a structure of a light-emitting device according to a still further embodiment of the present invention.
Figure 13:
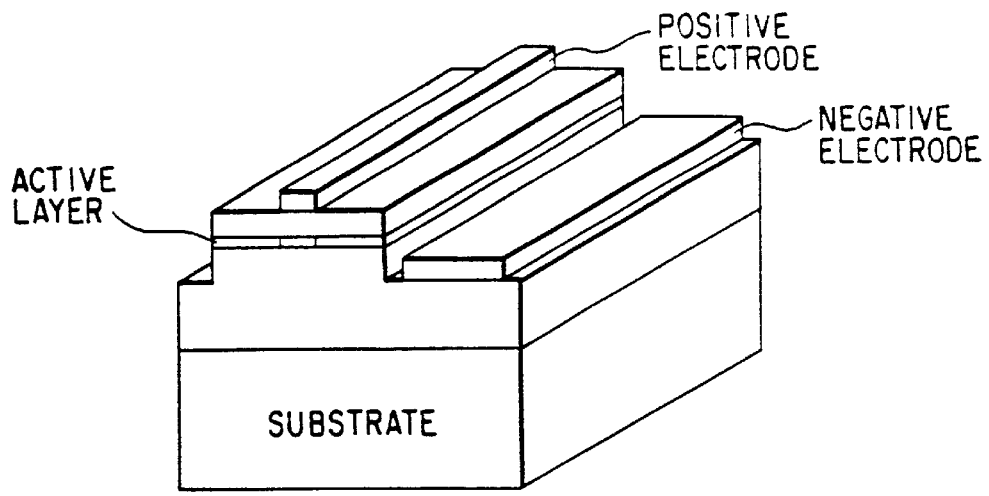
FIG. 13 is a oblique view of the structure of FIG. 12.

FIG. 12 schematically illustrates a sectional view of a light-emitting device provided with such a light-reflecting film, and FIG. 13 shows a perspective view of the light-emitting device shown in FIG. 12. These Figures illustrate a structure of a laser device wherein the reference numeral 100 represents a first multi-layered film, and 200, a second multi-layered film. The first multi-layered film 100 and the second multi-layered film 200 are each formed of nitride semiconductors differing in composition and in refractive index which are alternately superimposed under the condition, for example, of λ/4n (λ: wavelength; n: refractive index) thereby forming a two or more-ply structure so as to reflect the emission wavelength of the active layer 156. As seen in FIG. 12, the first multi-layered film 100 is interposed between the second n-type clad layer 154 and the n-type contact layer 153, and the second multi-layered film 200 is interposed between the second p-type clad layer 158 and the p-type contact layer 159, so that if a laser oscillation is effected using for example a stripe electrode of 10 μm or less as a positive electrode as shown in FIG. 13, the light emission from the active layer 156 can be confined through these multi-layered films in the active layer to easily allow the generation of a laser oscillation. The conductivity type of these multi-layered films is determined by the doping of a donor impurity or an acceptor impurity. The first multi-layered film 100 is interposed between the second n-type clad layer 154 and the n-type contact layer 153 in the embodiment shown in FIG. 12. However, the first multi-layered film 100 may be formed within the n-type contact layer 153. It is also possible to form the second multi-layered film 200 within the p-type contact layer 159. Even if these multi-layered films are formed within these contact layers, the effect of confining the light emission of the active layer 156 is the same. It is also possible to omit either one of the first multi-layered film 100 and the second multi-layered film 200. If the first multi-layered film 100 is omitted for example, a light-reflecting film may be formed on the surface of the sapphire substrate 151 in place of the first multi-layered film 100.

If a laser device is to be prepared using an insulating material such as sapphire as a substrate as shown in FIG. 12, the resultant structure of laser device would be of a flip chip system, i.e. a system wherein both positive and negative electrodes are drawn out from the same side. In this case, the first multi-layered film 100 to be formed on the n-type layer side as shown in FIG. 12 should preferably be disposed on the p-type layer side of the horizontal plane of the contact layer 153 forming a negative electrode. Because if the first multi-layered film 100 is disposed on the substrate 151 side of the horizontal plane of the contact layer 153, a difference in refractive index between the second n-type clad layer 154 and the n-type contact layer 153 becomes too small, so that the light emission of the active layer 156 may be diffused into the n-type contact layer 153 disposed below the active layer 156, failing to confine the light. This is an effect peculiar to the nitride semiconductor laser using an insulating substrate such as sapphire.

At least either one of two kinds of nitride semiconductors constituting the multi-layered film should preferably be formed of a nitride semiconductor containing indium and gallium {for example, $In_cGa_{1-c}N$ ($0 < c < 1$)} or GaN. Because, a GaN layer or an $In_cGa_{1-c}N$ layer functions as a buffer when a multi-layered film is to be formed by laminating a plurality of single layers, so that the formation of crack in the other single layer can be effectively avoided. The effect mentioned above can be ascribed to the softness of crystal structure of these GaN and $In_cGa_{1-c}N$ layers as compared with that of AlGaN layer. By contrast, if a multi-layered film having a total thickness of 0.5 μm or more is to be formed using a plurality of AlGaN layers, each having a different Al content from one another, cracks may be inevitably introduced in the multi-layered film, making it very difficult to prepare an intended device.

Most preferable examples of the combination of two kinds of nitride semiconductors constituting the multi-layered film are those wherein one of them is formed of GaN or $In_cGa_{1-c}N$, and the other is formed of a nitride semiconductor containing aluminum and/or gallium {for example, $Al_dGa_{1-d}N$ ($0 \leq d < 1$)}. Because, since the refractive index of $In_cGa_{1-c}N$ much differs from that of $Al_dGa_{1-d}N$, a multi-layered film having a large reflectance in conformity with the emission wavelength can be designed by making the most of these materials. Moreover, since the $In_cGa_{1-c}N$ functions as a buffer layer, the $Al_dGa_{1-d}N$ layers to be formed will be free from cracks, so that a multi-layered film of more than 10-ply structure can be realized. By the way, the refractive index of each of InN, GaN and AlN is 2.9, 2.5 and 2.15, respectively. Assuming that the refractive index of mixed crystal obeys Vegard's law, the refractive index of these mixed crystals can be calculated in proportion to the composition.

A nitride semiconductor light-emitting device according to an eighth embodiment of the present invention comprises an active layer having a first main surface and a second main surface and consisting of a nitride semiconductor containing indium and gallium. This eighth embodiment is featured in that a first n-type clad layer formed of an n-type nitride semiconductor having a larger band gap than that of the active layer and containing indium and gallium is formed in contact with the first main surface of the active layer, and at the same time or alternatively, a first p-type clad layer formed of a p-type nitride semiconductor having a larger band gap than that of the active layer and containing indium and gallium {for example, a p-type $In_zGa_{1-z}N$ ($0 \leq z < 1$)} is formed in contact with the second main surface of the active layer. Namely, this eighth embodiment is based on the findings that if a clad layer formed of InGaN having a larger band gap than that of an $In_xGa_{1-x}N$ layer is disposed on either the first main surface or the second main surface of the $In_xGa_{1-x}N$ active layer, the output of the resultant light-emitting device can be improved.

Figure 14:
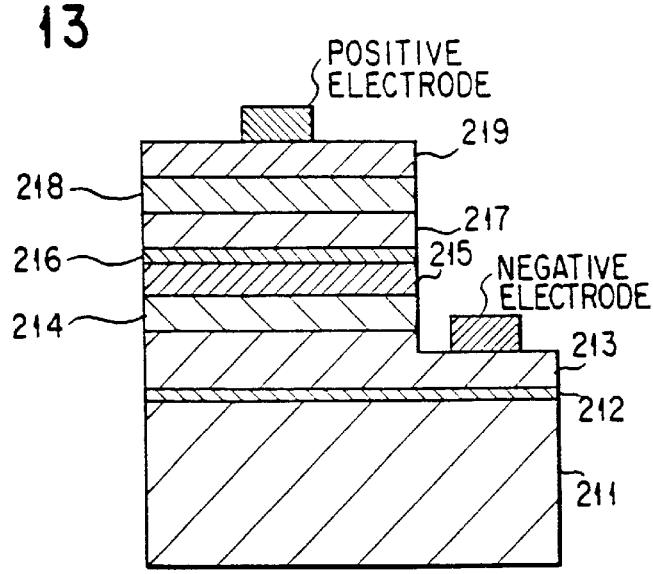
FIG. 14 is a cross-sectional view schematically illustrating a structure of a light-emitting device according to a eighth embodiment of the present invention.

FIG. 14 shows a cross-sectional view schematically illustrating a structure of a light-emitting device according to the eighth embodiment of the present invention. The light-emitting device shown in FIG. 14 comprises a substrate 211 on which a buffer layer 212 for alleviating a lattice mismatching between the substrate 211 and the nitride semiconductor layer, an n-type contact layer 213 for forming a negative electrode thereon, a second n-type clad layer 214, a first n-type clad layer 215, an active layer 216, a first p-type clad layer 217, a second p-type clad layer 218 and a p-type contact layer 219 for forming a positive electrode thereon are superimposed in the mentioned order.

The active layer 216 ($In_xGa_{1-x}N$) may be either n-type or p-type, but should preferably be a non-doped layer (impurities are not doped) in view of obtaining a laser device exhibiting a strong band-to-band emission and having a narrow half band width of emission wavelength. Further, the active layer 216 may be doped with an n-type dopant and/or a p-type dopant. If the active layer 216 is doped with an n-type dopant, it is possible to further increase the band-to-band light-emitting intensity as compared with the non-doped active layer. It is possible, through the doping with a p-type dopant, to shift a peak wavelength toward the lower energy side by a magnitude of about 0.5 eV from the peak wavelength of the band-to-band emission. If the doping is performed using both n-type dopant and p-type dopant on the active layer, the light-emitting intensity of the active layer will be further intensified as compared with an active layer doped only with an acceptor impurity. If the active layer is to be doped with a p-type dopant, the conductivity type of the active layer should preferably be turned into n-type by doping it with an n-type dopant such as Si together with the doping of the p-type dopant. In order to obtain a laser device through the growth of active layer of excellent crystallinity, the employment of a non-doped material for the active layer is most desirable, as mentioned earlier. The active layer should preferably be of a multi-quantum well or single-quantum well structure. In such a case, the thickness of the well layer and the thickness of the barrier layer are as described with reference to the first embodiment.

The provision of either the first n-type clad layer 215 (an n-type $In_yGa_{1-y}N$) alone or the first p-type clad layer 217 (a p-type $In_zGa_{1-z}N$) alone may be sufficient, but most preferably, both of the clad layers 215 and 217 should be formed as shown in FIG. 14. Since the crystals of the first n-type clad layer 215 and the first p-type clad layer 217, both containing indium, are soft, these clad layers function as a buffer layer just like a cushion, so that the generation of cracks in any of the second n-type clad layer 214, the second p-type clad layer 218, the n-type contact layer 213 and the p-type contact layer 219 to be subsequently formed as explained hereinafter can be prevented. A preferable range of the thickness of the InGaN as a buffer layer is 300 angstroms or more in total thickness in the combination of the active layer 216 and the first n-type clad layer 215; the active layer 216 and the first p-type clad layer 217; or the active layer 216, the first n-type clad layer 215 and the first p-type clad layer 217. In the structure of a light-emitting device, the first n-type clad layer 215 may be omitted, allowing the second n-type clad layer 214 to function, taking the place of the first n-type clad layer 215, or the first p-type clad layer 217 may be omitted, allowing the second p-type clad layer 218 to function, taking the place of the first p-type clad layer 217 as described hereinafter.

In the above description, the first n-type clad layer 215, the active layer 216 and the first p-type clad layer 217, all consisting of InGaN have been explained. It is desirable in these layers to control the ratio of In in these InGaN, i.e., "x", "y" and "z" values to 0.5 or less, preferably 0.3 or less, most preferably 0.2 or less. Because, as the molar ratio of indium is increased, the crystallinity of these InGaN tends to become more deteriorated, thus possibly lowering the light-emitting output. It should be understood that the formulas of $In_xGa_{1-x}N$, $In_yGa_{1-y}N$ and $In_zGa_{1-z}N$ also include those wherein a minor portion of Ga in these compositions is substituted by Al, i.e., InAlGaN as far as this substitution does not substantially diminish the effect of these InGaN composition. For example, if the value of b' in the formula of $In_{a'}Al_{b'}Ga_{1-a'-b'}N$ is not more than 0.1, the original effects of the first n-type clad layer, the active layer and the second p-type clad layer would not be altered. However, since the inclusion of Al would cause a hardening of the resultant crystal, it is preferred, in order to maximize the emission output, to constitute the first n-type clad layer 215, the active layer 216 and the first p-type clad layer 217 by employing only the ternary mixed crystal of InGaN containing no aluminum rather than employing the quaternary mixed crystal of nitride semiconductor.

The provision of either the second n-type clad layer 214 formed of an n-type nitride semiconductor containing aluminum and gallium {for example, an n-type $Al_aGa_{1-a}N$ ($0 \leq a < 1$)} alone or the second p-type clad layer 218 formed of a p-type nitride semiconductor containing aluminum and gallium {for example, a p-type $Al_bGa_{1-b}N$ ($0 \leq b < 1$) alone may be sufficient, but desirably the second n-type clad layer 214 should be disposed in contact with the first n-type clad layer 215, and at the same time the second p-type clad layer 218 should be disposed in contact with the first p-type clad layer 217 as shown in FIG. 14. The thickness of each of the second n-type clad layer 214 and the second p-type clad layer 218 should preferably be in the range of 50 angstroms to 0.5 μm. The ratio of Al in the AlGaN composition, i.e. the value of "a" or "b" should preferably be 0.6 or less, more preferably 0.4 or less. Because, since the crystal of AlGaN is hard, a crack may be generated if the value of "a" or "b" exceeds 0.6. This is also true even if a buffer layer consisting of InGaN is disposed, i.e., cracks may more likely be generated if the value of "a" or "b" exceeds 0.6.

It should be understood that the formulas of $Al_aGa_{1-a}N$ and $Al_bGa_{1-b}N$ also include those wherein a minor portion of Ga in these compositions is substituted by In, i.e. InAlGaN as far as this substitution does not substantially diminish the effect of these AlGaN composition. For example, if the value of a' in the formula of $In_{a'}Al_bGa_{1-a'-b}N$ is not more than 0.1, the original effects of the AlGaN would not be altered. However, since the inclusion of In, even if in a small amount, would cause a decrease of band gap, measures have to be taken to make the band gap thereof higher than those of the first n-type clad layer 215, the active layer 216 and the second p-type clad layer 218. Further, since the inclusion of In may cause the deterioration in crystallinity of the resultant crystal and hence the lowering of emission output, it is most preferred to employ only the ternary mixed crystal of AlGaN containing no indium rather than employing the quaternary mixed crystal of nitride semiconductor for the formations of the second n-type clad layer 214 and the second p-type clad layer 218 thereby increasing the emission output. With the employment of a layer containing aluminum for formation of the second n-type clad layer 214 and the second p-type clad layer 218, it is possible to enlarge the band gap thereof in relative to the first n-type clad layer 215, the active layer 216 and the first p-type clad layer 217.

Preferred combinations of the active layer and the first clad layers are those wherein the first n-type clad layer is formed of $In_yGa_{1-y}N$, the active layer is formed of $In_xGa_{1-x}N$, and the first p-type clad layer is formed of $In_zGa_{1-z}N$. It should be noted that the relationships y<x and z<x must be satisfied from the view point of the band gap relationship. Preferably, the active layer is of a multi-quantum well or single-quantum well structure and may be n-type or non-doped. The active layer of such a quantum well structure allows light of narrow half band width to emit based on the band-to-band emission.

The most preferred combinations of the active layer and the first clad layers are those wherein the first n-type clad layer is formed of $In_yGa_{1-y}N$; the active layer, formed of $In_xGa_{1-x}N$; the first p-type clad layer, formed of $In_zGa_{1-z}N$; the active layer, formed of $Al_bGa_{1-b}N$. With these combinations, it is possible to form a double-heterostructure of nitride semiconductor layers having an excellent crystallinity, thus making it possible to greatly improving the emission output.

The n-type contact layer 213 should preferably be disposed in contact with the second n-type clad layer 214, and at the same time the p-type contact layer 219 should be disposed in contact with the second p-type clad layer 218 as shown in FIG. 14. It is also possible to form the n-type contact layer 213 in contact with either the second n-type clad layer 214 or the first n-type clad layer 215, and likewise to form the p-type contact layer 219 in contact with either the second p-type clad layer 218 or the first p-type clad layer 214. In other words, if the second n-type clad layer 214 is omitted, the n-type contact layer 213 may be disposed in contact with the first n-type clad layer 215, and likewise, if the second p-type clad layer 218 is omitted, the p-type contact layer 219 may be disposed in contact with the first p-type clad layer 217. It may be also possible in a case to omit both of the first n-type clad layer 215 and the second n-type clad layer 214, thus rendering the n-type contact layer 213 to function as a clad layer, and likewise to omit both of the first p-type clad layer 217 and the second p-type clad layer 218, thus rendering the p-type contact layer 219 to function as a clad layer. However, if these clad layers are omitted, the emission output will be greatly diminished as compared with the case where these clad layers are not omitted. Therefore, the structure of light-emitting device shown in FIG. 14 is one of the most preferable structures in the present invention.

The n-type contact layer 213 and the p-type contact layer 219 are most preferably constituted by GaN as a nitride semiconductor not containing Al and In. Since these contact layers are adapted to be used for forming electrodes thereon, if these contact layers are formed of a layer excellent in crystallinity and high in carrier concentration, an excellent ohmic contact with an electrode material will be realized. Therefore, the employment of GaN is most preferable. Preferable examples of electrode material which are capable of forming an excellent ohmic contact with the n-type contact layer 213 are metallic materials containing both Ti and Al. Preferable examples of electrode material which are capable of forming an excellent ohmic contact with the p-type contact layer 219 are metallic materials containing both Ni and Au. When a contact layer made of GaN is employed as an electrode-bearing layer, a light-emitting device having a lowered Vf value and an improved light-emitting efficiency can be realized.

Figure 15:
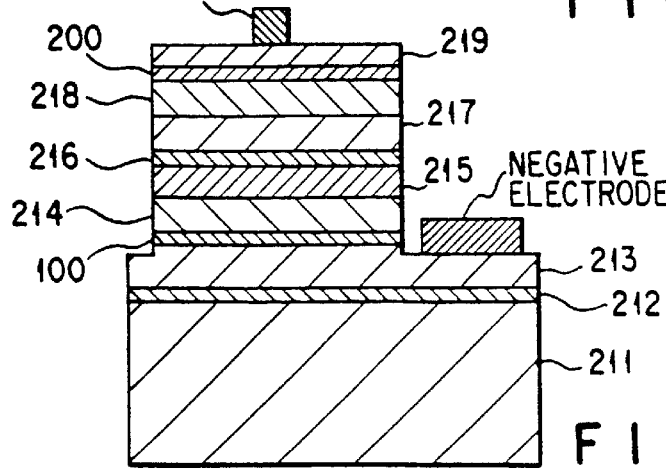
FIG. 15 is a cross-sectional view schematically illustrating a structure of a light-emitting device according to a still further embodiment of the present invention.

FIG. 15 schematically shows a cross-section of a structure of a light-emitting device according to another example of the present invention. A perspective view of this light-emitting device is the same as that shown in FIG. 13. The light-emitting device shown in this FIG. 15 illustrates an example wherein the same multi-layered films 100 and 200 as explained in detail with reference to FIG. 12 are employed.

A nitride semiconductor light-emitting device according to a ninth embodiment of the present invention is provided with a first n-type clad layer formed of an n-type nitride semiconductor having a smaller thermal expansion coefficient than that of an active layer, a first p-type clad layer formed of a p-type nitride semiconductor having a smaller thermal expansion coefficient than that of the active layer, and the active layer formed of a nitride semiconductor containing at least indium and provided between the first n-type clad layer and the first p-type clad layer. The active layer is fabricated into a single-quantum well structure or a multi-quantum well structure explained earlier, so that light of lower energy than the inherent band gap energy of the composition of the active layer per se can be obtained. Namely, the active layer is fabricated into a single-quantum well structure or a multi-quantum well structure, and a tensile stress in the direction parallel to the interface planes between the active layer and the clad layers is caused to generate, thereby making it possible to emit light of lower energy as compared with the inherent band gap energy of the composition of the active layer per se.

Namely, the device according to the ninth embodiment of the present invention is featured in that an active layer having a higher thermal expansion coefficient than those of the first n-type clad layer and the first p-type clad layer is formed so as to generate a tensile stress in the direction parallel to the interface planes between the active layer and both of the clad layers. In order to elastically apply the tensile stress to the active layer, the active layer is formed into a single-quantum well structure or a multi-quantum well structure thereby to make the band gap energy of the active layer small and to shift the emission wavelength of the active layer toward the longer side. Moreover, the thickness of the well layer and barrier layer of the active layer is made as thin as the critical level thereof, thus making it possible to grow an InGaN layer of excellent crystallinity regardless of a relatively large ratio of In.

The inherent band gap energy, Eg, of $In_aGa_{1-a}N$ can be calculated from the equation:

$$Eg=Eg1\times a+Eg2\times(1-a)-a\times(1-a)$$

where Eg1 is the band gap energy of InN (1.96 eV), and Eg2 is the band gap energy of GaN (3.40 eV). The inherent emission wavelength of $In_aGa_{1-a}N$ is calculated as 1,240/Eg.

The single-quantum well structure and multi-quantum well structure are as explained above. To reiterate, an active layer of the single-quantum well structure is a single well layer. An active layer of the multi-quantum well structure is a laminate of a plurality of swell layer and a plurality of barrier layers, wherein the well layer and the barrier layer are alternately stacked, with the well layers constituting the two outermost layer of the laminate.

Figure 16:
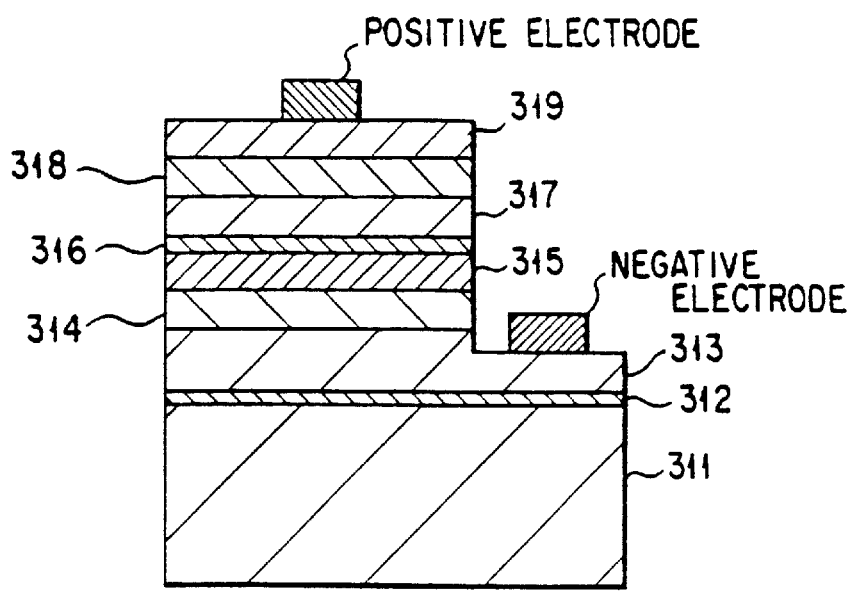
FIG. 16 is a cross-sectional view schematically illustrating a structure of a light-emitting device according to a ninth embodiment of the present invention.

FIG. 16 shows a cross-sectional view schematically illustrating a structure of a light-emitting device according to the ninth embodiment of the present invention. The light-emitting device shown in FIG. 16 comprises a substrate 311 on which a buffer layer 312, an n-type contact layer 313, a second n-type clad layer 314, a first n-type clad layer 315, an active layer 316, a first p-type clad layer 317, a second p-type clad layer 318 and a p-type contact layer 319 are superimposed in the mentioned order.

According to this ninth embodiment, the active layer 316 is formed of a nitride semiconductor containing In and formed into a single-quantum well structure or a multi-quantum well structure. Since the active layer 316 containing In is relatively soft and higher in thermal expansion coefficient as compared with the other nitride semiconductor such as AlGaN or GaN, it is possible to alter the emission wavelength by thinning the thickness of the well layer, for example, of a single-quantum well structure. The active layer 316 of the quantum well structure may be n-type or p-type. But in view of narrowing the half band width of emission wavelength through a band-to-band emission so as to obtain a light emission excellent in color purity, the active layer 316 should preferably be formed of a non-doped layer (impurities are not doped). If the well layer of the active layer 316 is formed of $In_zGa_{1-z}N$ (0<z<1), it is possible to realize a light emission having a wavelength ranging from ultraviolet to red through a band-to-band emission, and at the same time to form an active layer having a large difference in thermal expansion coefficient relative to the clad layers. On the other hand, in the case of a multi-quantum well structure, the barrier layer may not be InGaN, but may be GaN.

The composition of the first n-type clad layer 315 may be suitably selected as long as it has a larger band gap energy and a smaller thermal expansion coefficient as compared with the active layer 316, but most preferable composition thereof is an n-type $In_xGa_{1-x}N$ (0≦x<1). Since the first n-type clad layer 315 formed of InGaN or GaN is soft in crystal as compared with a nitride semiconductor containing Al, the first n-type clad layer 315 formed of such a composition functions as a buffer layer. Namely, since this first n-type clad layer 315 functions as a buffer layer, no crack will be introduced into the active layer 316 even if the active layer 316 is formed into the quantum well structure.

Moreover, this first n-type clad layer 315 functions to prevent the second n-type clad layer 314 and the second p-type clad layer 318, each being disposed on the outer side of the first clad layers 315 and 316 respectively, from being cracked.

The composition of the first p-type clad layer 317 may be suitably selected as long as it has a larger band gap energy and a smaller thermal expansion coefficient as compared with the active layer 316, but most preferable composition thereof would be a p-type $Al_yGa_{1-y}N$ (0≦y<1). When a nitride semiconductor containing Al such as a p-type AlGaN is selected to form a clad layer in contact with an active layer of the multi-quantum well structure or single-quantum well structure, the light-emitting output of the resultant device will be improved.

Either one of the first n-type clad layer 315 and the first p-type clad layer 317 may be omitted. If the first n-type clad layer 315 is omitted, the second n-type clad layer 314 takes the place of the first n-type clad layer 315, and if the first p-type clad layer 317 is omitted, the second p-type clad layer 318 takes the place of the first p-type clad layer 317. It is preferable however that the first n-type clad layer 315 consisting of an n-type InGaN or an n-type GaN is disposed in contact with the active layer.

According to the ninth embodiment of the present invention, a second n-type clad layer 314 formed of an n-type nitride semiconductor can be disposed in contact with the first n-type clad layer 315. This second n-type clad layer 314 should desirably be constituted by an n-type $Al_aGa_{1-a}N$ (0≦a≦1). However, if the first n-type clad layer 315 is formed of InGaN, the second n-type clad layer 314 may be formed of GaN or AlGaN. Since a nitride semiconductor containing Al is small in thermal expansion coefficient and hard in crystal, when it is formed as the second n-type clad layer 314 in contact with the first n-type clad layer 315, additional tensile stress will be effected on the active layer so that the emission wavelength of the active layer can be shifted toward the longer side. However, if the second n-type clad layer 314 containing Al is to be formed in contact with one main surface of the active layer 316, the opposite main surface of the active layer 316 should preferably be formed in advance with the first p-type clad layer 317 formed of InGaN or GaN acting as a buffer layer.

The thickness of the second n-type clad layer 314 ($Al_aGa_{1-a}N$ (0≦a<1)) should preferably be in the range of 50 angstroms to 1 µm. If the thickness of the second n-type clad layer 314 is controlled within this range, a tensile stress of preferable level will be acted on the active layer. The value of "a" should preferably be 0.6 or less, more preferably 0.4 or less. Because, since the crystal of AlGaN will be still too hard even if the possibility of crack being formed in the second n-type clad layer 314 is somewhat minimized by the presence of the first n-type clad layer 315, so that a crack may be generated in the AlGaN layer if the value of "a" exceeds over 0.6. Generally, the higher the ratio of Al in the AlGaN layer, the longer the emission wavelength of the active layer.

According to this embodiment, a second p-type clad layer 318 formed of a p-type nitride semiconductor can be disposed in contact with the first p-type clad layer 317. This second p-type clad layer 318 should desirably be constituted by an n-type $Al_bGa_{1-b}N$ (0≦b≦1). However, if the first p-type clad layer 315 is formed of AlGaN, the second p-type clad layer 318 may be GaN acting as a contact layer. However, if the second p-type clad layer 318 containing Al is to be formed in contact with one main surface of the active layer 316, the opposite main surface (n-layer side) of the active layer 316 should preferably be formed in advance with the first n-type clad layer 315 formed of InGaN or GaN acting as a buffer layer.

The effects to be derived from this second p-type clad layer 318 ($Al_bGa_{1-b}N$ ($0 \leq b \leq 1$)) are the same as those of the second n-type clad layer 314, so that the thickness of the second p-type clad layer 318 should preferably be in the range of 50 angstroms to 1 μm. The value of "b" should preferably be 0.6 or less, more preferably 0.4 or less. Generally, the higher the ratio of Al in the AlGaN layer, the longer the emission wavelength of the active layer.

With the employment of a nitride semiconductor layer containing Al or a GaN layer for the second n-type clad layer 314 or for the second p-type clad layer 318, a band gap relative to the active layer 316, the first n-type or p-type clad layers 315 or 317, each containing In, can be increased, hence to improve the emission efficiency. Moreover, it is also possible to increase the difference in thermal expansion coefficient relative to the active layer 316 so as to shift the emission wavelength of the active layer to a longer wavelength side.

Nest, examples of preferred combination of the active layer and the clad layer will be explained. First, examples of preferred combination of the active layer 316 and the first clad layers 315 and 317 are those wherein the first n-type clad layer is formed of $In_xGa_{1-x}N$ ($0 \leq x < 1$); the active layer, formed of a quantum well structure having a composition of $In_zGa_{1-z}N$ ($0 < z < 1$); and the first p-type clad layer, formed of $In_yGa_{1-y}N$ ($0 < y < 1$). In these combinations, it is of course required in view of band gap energy to meet the condition of x<z.

When the active layer 316 is of a single-quantum well structure, the thickness of the well layer should preferably be 100 angstroms or less, while the active layer 316 is of a multi-quantum well structure, the thickness of the well layer should preferably be 100 angstroms or less and the thickness of the barrier layer should preferably be 150 angstroms or less so as to obtain a light emission having a narrow half band width through a band-to-band emission in an n-type or non-doped state.

Most preferable examples of combination are those wherein the second n-type clad layer 314 is formed of $Al_aGa_{1-a}N$ ($0 \leq a \leq 1$); the first n-type clad layer 315, formed of $In_xGa_{1-x}N$ ($0 \leq x < 1$); the active layer 316, formed of a quantum well structure having a composition of $In_zGa_{1-z}N$ ($0 < z < 1$); the first p-type clad layer 317, formed of $In_yGa_{1-y}N$ ($0 \leq y < 1$) and the second p-type clad layer 318 is formed of $Al_bGa_{1-b}N$ ($0 \leq b \leq 1$). In this combination, either one of the first n-type clad layer 315 and the first p-type clad layer 317, or both, may be omitted. When these first clad layers are omitted, the second n-type clad layer 314 or the second p-type clad layer 318 takes the place of these first clad layers to function as a clad layer. If it is difficult in this combination of only the first clad layers 315, 317 and the active layer 316 to apply a sufficient tensile stress to the active layer, a second clad layers containing Al may be disposed on the outer side of the first clad layers 315 and 317 so as to increase a difference in thermal expansion coefficient between the second clad layers 314, 318 and the active layer 316. Therefore, by fabricating the active layer into a multi-quantum well structure comprising thin well layers and thin barrier layers, or into a single-quantum well structure comprising only of a single thin well layer, it is possible, through a tensile stress at the interface, to minimize the band gap of the active layer thereby to shift the emission wavelength to a longer wavelength side.

Still another preferred embodiment of the present invention is controlling the total thickness of the first n-type clad layer and the active layer to 300 angstroms or more in a device structure where an n-type nitride semiconductor containing indium or an n-type GaN is employed as the first n-type clad layer 315. Because, when the total thickness of these layers is 300 angstroms or more, it is possible to enable the GaN or InGaN layer to function as a buffer layer, thus allowing the active layer to be formed into a quantum well structure and preventing the first p-type clad layer 317 and the second p-type clad layer 318 from being cracked.

It should be understood that the formulas of $In_xGa_{1-x}N$, $In_yGa_{1-y}N$ and $In_zGa_{1-z}N$ also include those wherein a minor portion of Ga or In in these compositions is substituted by Al, i.e., InAlGaN as far as this substitution does not substantially diminish the effect of these InGaN composition. Likewise, the formulas of $Al_aGa_{1-a}N$, and $Al_bGa_{1-b}N$ should be considered to include those wherein a minor portion of Ga or Al in these compositions is substituted by In, i.e. InAlGaN as far as this substitution does not substantially diminish the effect of these AlGaN composition.

Further, the active layer 316 may be doped with a donor impurity and/or an acceptor impurity. If the active layer 316 can be doped with an impurity without affecting the crystallinity of the active layer, it is possible to further increase the band-to-band emission intensity as compared with the non-doped active layer. It is possible, through the doping with an acceptor impurity, to shift a peak wavelength toward the lower energy side by a magnitude of about 0.5 eV from the peak wavelength of the band-to-band emission though the half band width thereof may become wide. If the doping is performed using both an acceptor impurity and a donor impurity on the active layer, the light-emitting intensity of the active layer will be further intensified as compared with an active layer doped only with an acceptor impurity. If the active layer is to be doped with an acceptor impurity in particular, the conductivity type of the active layer should preferably be turned into n-type by doping it with a donor impurity such as Si together with the doping of the acceptor impurity. However, since the active layer should ideally be emitting a strong light through a band-to-band emission according to the present invention, the employment of a non-doped InGaN as material for the active layer is most desirable. Speaking in other way, if an active layer is doped with an impurity, the crystallinity of the resultant layer is more likely to be deteriorated as compared with a non-doped active layer. Moreover, a light-emitting device where a non-doped InGaN is employed as an active layer is advantageous in lowering Vf value as compared with a light-emitting device doped with an impurity.

The active layer in the multi-quantum well structure of the present invention is formed of a combination for example of InGaN/GaN or InGaN/InGaN (differs in composition), thus forming a thin film-laminated structure comprising a well layer/barrier combination. When the active layer is fabricated into a multi-quantum well structure, the emission output thereof will be improved as compared with that of the single-quantum well structure. In the case of an LED or LD device formed of a multi-quantum structure, the thickness of the well layer should be controlled to several angstroms to several tens angstroms, the thickness of the barrier layer should be also controlled to several angstroms to several tens angstroms. These thin layers are then alternately laminated to form a multi-quantum well structure. Preferable thickness of the well layer is 100 angstroms or less, more preferably 70 angstroms or less. The preferable range of the thickness of the layer mentioned above can be also applicable to the active layer of a single-quantum well structure.

On the other hand, a preferable range of the barrier layer is 150 angstroms or less, more preferably 100 angstroms or less. In the manufacture of a multi-quantum well structure, the well layer as well as the barrier layer may be doped with a donor impurity or an acceptor impurity. When a plurality of thin layers are laminated in this way, any distortion in the crystal can be elastically absorbed by the active layer.

As shown in FIG. 16, an n-type contact layer 313 formed of an n-type GaN for bearing an electrode thereon should preferably be disposed in contact with the first n-type clad layer 315 or the second n-type clad layer 314. Likewise a p-type contact layer 319 formed of a p-type GaN for bearing an electrode thereon should preferably be disposed in contact with the first p-type clad layer 317 or the second p-type clad layer 318. However, these contact layers 313 and 319 may be omitted, provided the second n-type clad layer 314 and the second p-type clad layer 318 are formed of GaN, i.e. each of the second clad layers 314 and 318 functions as a contact layer in such a case. The reason for forming these contact layers 313 and 319 is that it is difficult to obtain a satisfactory ohmic contact with an electrode with the employment of a mixed crystal consisting of ternary or higher mixture of devices such as the first clad layer or the second clad layer. Therefore, by employing GaN which is most suited for realizing an excellent ohmic contact as a material for a contact layer, an excellent ohmic contact with an electrode can be achieved, thus obtaining a light-emitting device of low Vf and excellent emission efficiency.

Figure 17:
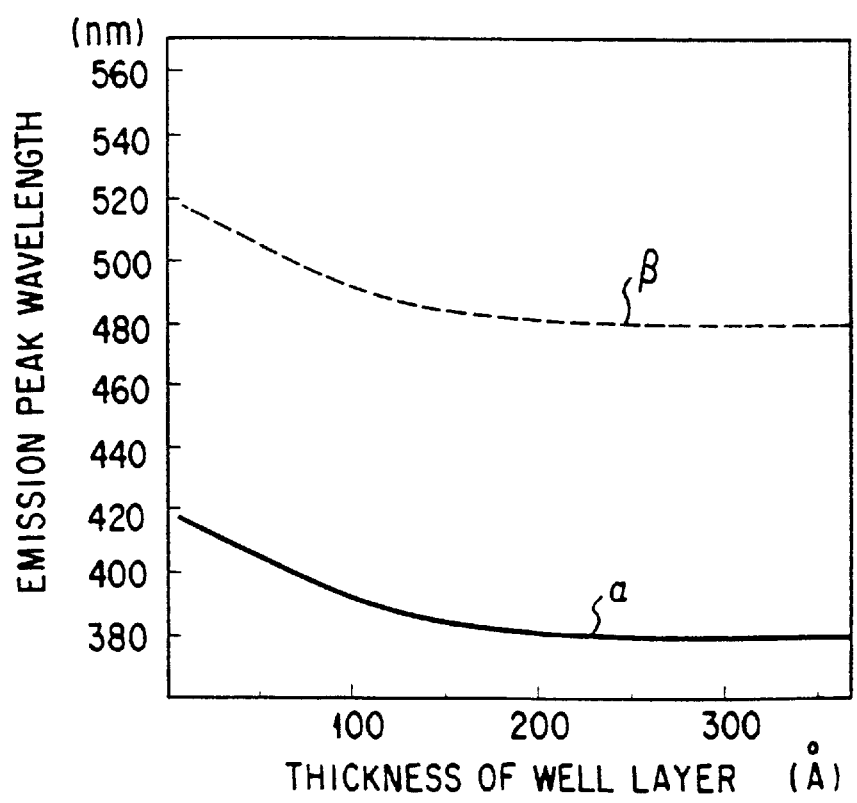
FIG. 17 is a graph showing a relationship between the thickness of a well layer and the emission peak wavelength.

FIG. 17 illustrates a relationship between the thickness of the active layer of a single-quantum well structure, i.e., the well layer, and the emission peak wavelength of a light-emitting device. The solid line indicated by "α" in FIG. 17 represents the result of a light-emitting device where the active layer thereof is represented by a non-doped $In_{0.05}Ga_{0.95}N$, while the dotted line indicated by "β" represents the result of a light-emitting device where the active layer thereof is represented by a non-doped $In_{0.3}Ga_{0.7}N$. The structure of both light-emitting devices is formed of a double-heterostructure comprising a second clad layer, a first n-type clad layer, an active layer, a first p-type clad layer and a second p-type clad layer laminated in the mentioned order. In both devices, the second n-type clad layer is formed of a Si-doped n-type $Al_{0.3}Ga_{0.7}N$ having a thickness of 0.1 $\mu$m, the first n-type clad layer is formed of a $In_{0.01}Ga_{0.99}N$ having a thickness of 500 angstroms, the first p-type clad layer is formed of a Mg-doped p-type $Al_{0.01}Ga_{0.99}N$ having a thickness of 20 angstroms, and the second p-type clad layer is formed of a Mg-doped p-type $Al_{0.3}Ga_{0.7}N$ having a thickness of 0.1 $\mu$m. FIG. 17 illustrates that the emission wavelength changes with a change in thickness of the active layer.

The active layer formed of $In_{0.05}Ga_{0.95}N$ indicated by "α" gives an ultraviolet emission in the vicinity of 380 nm according to its inherent band gap energy, but can be changed to give a bluish purple emission by thinning the thickness so as to shift the wavelength to approximately 420 nm. On the other hand, the active layer formed of $In_{0.3}Ga_{0.7}N$ indicated by "β" gives a bluish green emission in the vicinity of 480 nm according to its inherent band gap energy, but can be changed to give a pure green emission of approximately 520 nm by thinning the thickness. As explained above, it is possible to shift the emission wavelength to a longer wavelength side by thinning the active layer interposed between the first n-type clad layer and the first p-type clad layer. Namely, in the ordinary active layer of large thickness, an emission corresponding to the inherent band gap energy of the active layer could be obtained.

However, in the active layer formed of a single-quantum well structure according to the present invention, it is possible to minimize the band gap energy through the thinning in thickness of the well layer, so that light of lower energy or light of longer wavelength as compared with that to be obtained through the inherent band gap energy of the well layer can be obtained. Moreover, since it is of a non-doped layer, a layer of more excellent crystallinity than that of the doped layer can be obtained, giving a higher output. As a result, an emission excellent in color purity with a narrowed half band width can be obtained through a band-to-band emission.

When the conventional thick $In_zGa_{1-z}N$ is employed for the active layer, the resultant active layer would be poor in crystallinity. For example, if the ratio of In, i.e., "z", is 0.3 to 0.5, the resultant crystal would become poor, exhibiting very low emission output. However, when the active layer is made thinner, a crystal of excellent crystallinity can be obtained even if the ratio of In is relatively high.

Thus, the thickness of the well layer should preferably be controlled to 100 angstroms or less, more preferably 70 angstroms or less. FIG. 17 shows the features of one example of a light-emitting device according to the present invention, indicating that the range of wavelength that can be shifted to the longer wavelength of emission also differs depending on the compositions of the second clad layer and the first clad layer giving a tensile stress to the active layer. Also, the range of preferable thickness of the active layer somewhat changes depending on the compositions of these layers.

It is known that the thermal expansion coefficient of AlN is $4.2 \times 10^{-6}$/K, and the thermal expansion coefficient of GaN is $5.59 \times 10^{-6}$/K. The thermal expansion coefficient of InN is not clear, since the complete form of crystal thereof is not yet obtained. However, assuming that the thermal expansion coefficient of InN is the highest among these nitride semiconductors, the order in magnitude of thermal expansion coefficient would become as follows: InN>GaN>AlN. With respect to the growth temperature of these nitride semiconductors, the growth temperature may be 500° C. or more in general in the case of the MBE method, and 900° C. or more sometimes in the case of the MOVPE method. For example, according to the MOVPE method, InGaN can be grown at a temperature of 700° C. or more, and AlGaN can be grown at a temperature of 900° C. Therefore, when a pair of clad layers having a smaller thermal expansion coefficient than that of an active layer are formed at a high temperature while sandwiching therebetween the active layer having a comparatively large thermal expansion coefficient and then the temperature is lowered down to room temperature, the active layer having a comparatively large thermal expansion coefficient is pulled by the clad layers, hence a tensile stress in the direction parallel to the interface between the active layer and the clad layers is effected on the active layer. Because of this, the band gap energy of the active layer is minimized, causing an elongation of the emission wavelength. The thermal expansion coefficient of the active layer formed of $In_{0.05}Ga_{0.95}N$ or $In_{0.3}Ga_{0.7}N$ is larger than that of the first and the second clad layers, because of the larger ratio of In as compared with the ratio of In in the compositions of these clad layers. Therefore, a tensile stress parallel to the interface between the active layer and the clad layers is caused to generate, thus making small the band gap energy of the active layer, hence the emission wavelength is shifted to a longer wavelength side as compared with that of the ordinary band-to-band emission. Since this tensile stress can be increased as the thickness of the active layer becomes thinner, it is possible to obtain a longer wavelength as compared with the ordinary emission wavelength.

A preferable example of the light-emitting device according to the ninth embodiment of the present invention comprises a first n-type clad layer formed of an n-type nitride semiconductor containing indium or an n-type GaN, and an active layer formed in contact with the first n-type clad layer and made of a nitride semiconductor containing at least indium and having a larger thermal expansion coefficient than that of the first n-type clad layer, wherein the active layer is fabricated into a single-quantum well structure or a multi-quantum well structure so as to obtain a light of lower energy as compared with the inherent band gap energy of the active layer. It is also preferred in this light-emitting device to control the total thickness of the first n-type clad layer and the active layer to 300 angstroms or more. As another preferable example of the light-emitting device according to the ninth embodiment, the light-emitting device is provided with an active layer fabricated into a single-quantum well structure or a multi-quantum well structure by the employment of a nitride semiconductor containing indium, and with a first p-type clad layer formed of a p-type nitride semiconductor containing aluminum and having a larger thermal expansion coefficient than that of the active layer so as to obtain a light of lower energy as compared with the inherent band gap energy of the active layer.

According to the ninth embodiment of the present invention, additional first n-type clad layer 315 is formed in contact with the active layer 316 containing In and Ga. This first n-type clad layer 315 functions as a buffer layer between the active layer and the second n-type clad layer 314 containing Al. Namely, since GaN or the nitride semiconductor containing In constituting the first n-type clad layer 315 is inherently soft in crystal, any distortion to be generated due to the mismatching of lattice constants or due to a difference in thermal expansion coefficient between the second n-type clad layer 314 and the active layer 316 can be absorbed by the first n-type clad layer 315. Due to this reason, the possibility of generating a crack in the active layer 316 and the second n-type clad layer 314 is assumed to be minimized even if the active layer is made thinner. Since the distortion is absorbed by the first n-type clad layer 315 as mentioned above, the active layer can be elastically deformed by a tensile stress when the thickness of the active layer is 200 angstroms or less, thereby decreasing the band gap energy and possibly enlarging the emission wavelength. Moreover, the crystal defect in the active layer can be diminished. Therefore, it is possible improve the crystallinity of the active layer even if the active layer is made thinner, thus increasing the emission output. In order to allow the first n-type clad layer 315 to function as a buffer layer, the total thickness of the active layer 316 having a soft crystal structure and the first n-type clad layer 315 should preferably be controlled to 300 angstroms or more.

If the first p-type clad layer is formed of a nitride semiconductor containing Al, the emission output would be improved, due assumably to the fact that AlGaN can be more easily turned into p-type as compared with other nitride semiconductors or the decomposition of the active layer formed of InGaN is inhibited by the AlGaN as during the step of growing the first p-type clad layer. However, the precise reason on this is not yet clear.

The manufacture of a light-emitting device comprising a nitride semiconductor can be performed using for example MOVPE (Metal Organic Vapor Phase Epitaxy), MBE (Molecular Beam Epitaxy) or HDVPE (Hydride Vapor Phase Epitaxy) method. For example, a light-emitting device can be fabricated by laminating $In_aAl_bGa_{1-a-b}N$ ($0 \leq a$; $0 \leq b$; $a+b \leq 1$) of n-type or p-type on a substrate so as to obtain a double-heterostructure. As for the material for the substrate sapphire (including the C-plane, R-plane and A-plane thereof), SiC (including 6H—SiC and 4H—SiC), Si, ZnO, GaAs, spinel ($NgAl_2O_4$, particularly (111) plane thereof), and a monocrystaline oxide (such as NGO) may be employed. The n-type nitride semiconductor can be obtained in a non-doped state, but may also be obtained by diffusing a donor impurity such as Si, Ge or S into the semiconductor during the crystal growth thereof. The p-type nitride semiconductor may be formed by diffusing an acceptor impurity such as Mg, Zn, Cd, Ca, Be or C into the semiconductor during the crystal growth thereof, or by diffusing the acceptor impurity and then performing an annealing at a temperature of 400° C.

The present invention has been described with reference to the first to ninth embodiments thereof, and will be further explained below by way of its Examples. However, the present invention should not be limited thereto, and the features and explanations described with reference to one embodiment can be applied to the other embodiments where appropriate. For example, the carrier concentration of the layers explained with reference to the fifth and sixth embodiments can be applied to the other embodiments, even if the materials of the layers are different.

Example 1

This Example 1 will be explained with reference to FIG. 1 as follows.

First, using TMG (trimethylgallium) and $NH_3$ as raw materials, a buffer layer formed of GaN was grown at a temperature of 500° C. to a thickness of 200 angstroms on the C-plane of a sapphire substrate 11 which had been set in advance in a reaction vessel.

Then, the temperature was raised up to 1050° C., upon which silane gas was added to the TMC and $NH_3$, thereby growing an n-type contact layer 12 consisting of Si-doped n-type GaN to a thickness of 4 μm in thickness.

Subsequently, the temperature was lowered down to 800° C., and TMI (trimethylindium) was added to the raw material gas thereby growing an n-type clad layer 13 formed of Si-doped n-type $In_{0.05}Ga_{0.95}N$ to a thickness of 500 angstroms.

While keeping this temperature of 800° C., an active layer 14 of a single-quantum well structure consisting of non-doped n-type $In_{0.2}Ga_{0.8}N$ was grown to a thickness of 20 angstroms.

Then, the temperature was raised up again to 1050° C., upon which TMG, TMA (trimethylaluminum), $NH_3$ and $Cp_2Mg$ (cyclopentadienylmagnesium) were employed to grow a first p-type clad layer 61 consisting of a Mg-doped p-type $Al_{0.1}Ga_{0.9}N$ to a thickness of 0.1 μm.

While keeping this temperature of 1050° C., a second p-type clad layer 62 consisting of Mg-doped p-type $Al_{0.3}Ga_{0.7}N$ was grown to a thickness of 0.5 μm.

Then, at this temperature of 1050° C., a p-type contact layer 15 consisting of Mg-doped GaN was grown to a thickness of 1.0 μm.

After the completion of the reaction, the temperature was lowered down to room temperature, and the wafer obtained was taken out and then the annealing of the wafer was performed at a temperature of 700° C. so as to lowering the resistivity of the p-type layers. Then, an etching was performed so as to allow the surface of the n-type contact layer 12 to expose out of the uppermost layer of the p-type contact layer 15. After finishing the etching, a current-contracting layer 16 consisting of $SiO_2$ and having an opening 16a was formed on the surface of the p-type contact layer 15, and then a positive electrode 17 consisting of Ni and Au was formed on the current-contracting layer 16 to be connected with the p-type contact layer 15 through the opening 16a. Subsequently, a negative electrode 18 consisting of Ti and Al was formed.

Then, the surface of the sapphire substrate 11 on which the nitride semiconductor layers were not formed was polished to reduce the thickness of the substrate to 90 μm. Then, the M-plane (a plane corresponding to the side surface of a hexagonal column in the hexagonal crystal system) of the sapphire substrate was scribed and forcibly cleaved to form a laser chip. Then, a dielectric multi-layered film was formed on the cleaved surface of the chip, and the resultant chip was disposed in a heat sink, and a laser oscillation test was performed on this chip at room temperature to confirm the generation of a laser oscillation at 450 nm under a threshold current density of 2.0 $kA/cm^2$.

Example 2

This Example 2 will be explained with reference to FIG. 2 as follows.

In the same manner as in Example 1, a GaN buffer layer having a thickness of 200 angstroms was formed on a sapphire substrate 21, and an n-type contact layer 22 consisting of n-type GaN was formed to a thickness of 4 μm by the MOVPE method.

Then, after forming a second n-type clad layer 72 having a thickness of 0.5 μm and formed of Si-doped n-type $Al_{0.3}Ga_{0.7}N$, a first n-type clad layer 71 having a thickness of 500 angstroms and consisting of Si-doped n-type $In_{0.05}Ga0.95N$ was formed.

Then, an active layer 23 of a single-quantum well structure having a thickness of 20 angstroms and consisting of non-doped $In_{0.2}Ga_{0.8}N$ was grown, and then a p-type clad layer 24 having a thickness of 0.5 μm and consisting of a Mg-doped p-type $Al_{0.3}Ga_{0.7}N$, and a p-type Contact layer 25 having a thickness of 1.0 μm in thickness and consisting of Mg-doped GaN were successively deposited thereover.

Then, the same processes as in Example 1 were followed to obtain a laser Chip, which was then disposed in a heat sink to perform a laser oscillation, thus confirming the generation of a laser oscillation at 450 nm at a threshold current density of 2.0 $kA/cm^2$.

Example 3

This Example 3 will be explained with reference to FIG. 3 as follows.

First, a GaN buffer layer having a thickness of 200 angstroms, and an n-type contact layer 32 having a thickness of 4 μm and consisting of n-type GaN were formed in the same manner as in Example 1 on a sapphire substrate 31 by the MOVPE method.

Then, after forming a second n-type clad layer 82 having a thickness of 0.5 μm and formed of Si-doped n-type $Al_{0.3}Ga_{0.7}N$, a first n-type clad layer 81 having a thickness of 0.1 μm and consisting of Si-doped n-type $In_{0.05}Ga_{0.95}N$ was formed.

Then, an active layer 23 of a single-quantum well structure having a thickness of 20 angstroms and consisting of non-doped $In_{0.2}Ga_{0.8}N$ was grown, and then a first p-type clad layer 91 having a thickness of 0.1 μm and consisting of a Mg-doped p-type $Al_{0.3}Ga_{0.7}N$, a second p-type clad layer 92 having a InN>GaN>AlN. With respect to the growth temperature of these nitride semiconductors, the growth temperature may be 500° C. or more in general in the case of the MBE method, and 900° C. or more sometimes in the case of the MOVPE method. For example, according to the MOVPE method, InGaN can be grown at a temperature of 700° C. or more, and AlGaN can be grown at a temperature of 900° C. Therefore, when a pair of clad layers having a smaller thermal expansion coefficient than that of an active layer are formed at a high temperature while sandwiching therebetween the active layer having a comparatively large thermal expansion coefficient and then the temperature is lowered down to room temperature, the active layer having a comparatively large thermal expansion coefficient is pulled by the clad layers, hence a tensile stress in the direction parallel to the interface between the active layer and the clad layers is effected on the active layer. Because of this, the band gap energy of the active layer is minimized, causing an elongation of the emission wavelength. The thermal expansion coefficient of the active layer formed of $In_{0.05}Ga_{0.95}N$ or $In_{0.3}Ga_{0.7}N$ is larger than that of the first and the second clad layers, because of the larger ratio of In as compared with the ratio of In in the compositions of these clad layers. Therefore, a tensile stress parallel to the interface between the active layer and providing an active layer 23.

Then, the same processes after the formation of the active layer 23 were followed as in Example 3 to obtain a laser chip, which was then disposed in a heat sink to perform a laser oscillation, thus confirming the generation of a laser oscillation at 500 nm at a threshold current density of 0.9 $kA/cm^2$.

Example 5

The procedures of Example 1 were followed except that after the first clad layer 61 consisting of a Mg-doped p-type $Al_{0.1}Ga_{0.9}N$ was deposited to a thickness of 0.1 μm, a p-type contact layer 15 consisting of Mg-doped p-type GaN and having a thickness of 1.0 μm was grown on the first clad layer 61.

After the completion of the reaction, the annealing of the wafer was performed at a temperature of 700° C. in the same manner as in Example 1 so as to lower the resistivity of the p-type layers. Then, an etching was performed so as to allow the surface of the n-type contact layer 12 to expose out of the uppermost layer of the p-type contact layer 15. After finishing the etching, a positive electrode 17 consisting of Ni and Au was formed on the surface of the p-type contact layer 15. Subsequently, a negative electrode 18 consisting of Ti and Al was formed. Namely, an LED device was fabricated without forming a dielectric multi-layered film. This LED exhibited a blue emission at 450 nm and 3.5 V in Vf (forward voltage) under an If (forward current) of 20 mA. The emission output of the LED was 6 mW indicating a high output. The half band width of the emission spectrum was 20 nm indicating a sharp band-to-band emission.

Example 6

The procedures of Example 1 were followed, except that the formations of the current-contracting layer 16 and the dielectric multi-layered film in Example 1 were omitted, and a positive electrode 17 was directly formed on the p-type contact layer 15 as described in Example 5, fabricating an LED device. This LED device exhibited a blue emission at 450 nm and 3.5 V in Vf under an If of 20 mA. The emission output of the LED was 6 mW indicating a high output. The half band width of the emission spectrum was 20 nm as in the case of Example 5 indicating a sharp band-to-band emission.

Example 7

This example corresponds to the fourth embodiment of the present invention and will be explained with reference to FIG. 1 as follows.

In the same manner as explained in Example 1, a GaN buffer layer having a thickness of 200 angstroms, and an n-type contact layer 12 having a thickness of 4 µm and consisting of n-type GaN were formed on a sapphire substrate 11 by the MOVPE method.

Then, an active layer 14 of a single-quantum well structure having a thickness of 30 angstroms and Consisting of non-doped $In_{0.2}Ga_{0.9}N$ was directly formed on the surface of the n-type contact layer 12. Then, a first p-type clad layer 61 having a thickness of 0.05 µm and consisting of a Mg-doped p-type $Al_{0.1}Ga_{0.9}N$ and a p-type contact layer 15 having a thickness of 0.5 µm and consisting of Mg-doped p-type GaN were sequentially deposited thereover.

Then, in the same manner as in Example 5, a positive electrode 17 was formed directly on the p-type contact layer 15 to obtain an LED device. This LED device exhibited a blue emission at 450 nm and 3.5 V in Vf under an If of 20 mA. The emission output of the LED was 7 mW indicating a very high output. The half band width of the emission spectrum was 20 nm as in the case of Example 5 indicating a sharp band-to-band emission.

Comparative Example

The procedures of Example 5 were followed, except that after the first p-type clad layer 61 consisting of a Mg-doped p-type $Al_{0.1}Ga_{0.9}N$ was deposited to a thickness of 2 µm, a p-type contact layer 15 consisting of Mg-doped GaN was grown to a thickness of 1.0 µm on the first clad layer 61.

After the completion of the reaction, the p-type contact layer was observed with a microscope, finding a large number of crack formed therein. Further, the annealing of the wafer was performed similarly, and an LED device was fabricated therefrom similarly. This LED exhibited a blue emission at 450 nm, but Vf thereof was as high as 10 V under an If of 20 mA. The emission output of the LED was 100 µW or less.

Example 8

This Example 8 will be explained with reference to FIG. 9 as follows.

First, using TMG and $NH_3$ as raw materials, a buffer layer 122 having a thickness of 500 angstroms and consisting of GaN was grown at a temperature of 500° C. on the C-plane of a sapphire substrate 121 which had been set in advance in a reaction vessel.

Then, the temperature was raised up to 1050° C., upon which silane gas was added in addition to the TMG and $NH_3$, thereby growing an n-type contact layer 123 having a thickness of 4 µm and consisting of Si-doped n-type GaN. The carrier concentration of this n-type contact layer 123 was $2\times10^{19}/cm^3$.

Then, TMA was added, while keeping the same temperature of 1050° C., to the raw material gas thereby growing a second n-type clad layer 124 having a thickness of 0.1 µm and formed of Si-doped n-type $Al_{0.3}Ga_{0.7}N$. The carrier concentration of this second n-type clad layer 124 was $1\times10^{19}/cm^3$.

Subsequently, the temperature was lowered down to 800° C., and by using TMG, TMI, $NH_3$ and silane gases, a first n-type clad layer 125 having a thickness of 500 angstroms and formed of Si-doped n-type $In_{0.01}Ga_{0.99}N$ was grown. The carrier concentration of this first n-type clad layer 125 was $5\times10^{18}/cm^3$.

While keeping this temperature of 800° C. and by using TMG, TMI and $NH_3$, an active layer 126 having a thickness of 30 angstroms and consisting of non-doped $In_{0.05}Ga_{0.95}N$ was grown.

Then, the temperature was raised up again to 1050° C., upon which TMG, TMA, $NH_3$ and $Cp_2Mg$ were employed to grow a second p-type clad layer 128, 0.1 µm in thickness and consisting of a Mg-doped p-type $Al_{0.3}Ga_{0.7}N$. The hole carrier concentration of this second p-type clad layer 128 was $1\times10^{18}/cm^3$.

While keeping this temperature of 1050° C. and by using TMG, $NH_3$ and $Cp^2Mg$, a p-type contact layer 129 having a thickness of 0.5 µm and consisting of Mg-doped p-type GaN was grown. The hole carrier concentration of this p-type contact layer 129 was $5\times10^{19}/cm^3$.

After the completion of the reaction, the temperature was lowered down to room temperature, and the wafer obtained was taken out and then the annealing of the wafer was performed at a temperature of 700° C. so as to lowering the resistivity of the p-type layers. Then, after forming a mask of prescribed pattern on the surface of the uppermost p-type contact layer 129, an etching was performed so as to allow the surface of the n-type contact layer 123 to expose out of the uppermost p-type contact layer 129. After finishing the etching, a negative electrode consisting of Ti and Al was formed on the surface of the n-type contact layer 123, and a positive electrode consisting of Ni and Au was formed on the surface of the p-type contact layer 129.

After the electrodes were formed in this manner, the surface of the resultant wafer was cut into chips, each 350 µm×350 µm square, and fabricated into an LED device having a viewing angle of 15 degrees. This LED device exhibited a blue emission at 415 nm in peak wavelength and 3.5 V in Vf under an If of 20 mA. The emission output of the LED was 6 mW. The half band width of the emission spectrum was 20 nm exhibiting an emission of high color purity.

Example 9

This Example 9 will be explained with reference to FIG. 10 as follows.

The same processes as in Example 8 were followed up to the formation of a second n-type clad layer 134 consisting of n-type Si-doped $Al_{0.3}Ga_{0.7}N$. Then, an active layer 136 having a thickness of 40 angstroms and consisting of non-doped $In_{0.05}Ga_{0.95}N$ was grown on the surface of the second clad layer 134 under the same conditions as in Example 8.

Then, a first p-type clad layer 137 having a thickness of 500 angstroms and consisting of a Mg-doped p-type $In_{0.01}Ga_{0.99}N$ was deposited on the active layer 136 at a temperature of 800° C. by using TMG, TMI, $NH_3$ and $Cp_2Mg$. The hole carrier concentration after annealing of this first p-type clad layer 137 was $2\times10^{17}/cm^3$.

Then, after the formation of the first clad layer 157, the same processes as in Example 8 were followed to obtain an LED device shown in FIG. 10. This LED device exhibited an emission at 410 nm in peak wavelength and 3.5 V in Vf under an If of 20 mA. The half band width of the emission spectrwn was 20 nm, and the emission output of the LED was 5 mW.

Example 10

This Example 10 will be explained with reference to FIG. 11 as follows.

The same processes as in Example 8 were followed up to the formation of a first n-type clad layer 155 consisting of Si-doped n-type $In_{0.01}Ga_{0.99}N$. Then, an active layer 156 having a thickness of 40 angstroms and consisting of non-doped $In_{0.05}Ga_{0.95}N$ was grown on the surface of the first n-type clad layer 155 under the similar conditions to those in Example 8.

Then, a first p-type clad layer 157 having a thickness of 500 angstroms and consisting of a Mg-doped p-type $In_{0.01}Ga_{0.99}N$ was deposited on the active layer 156 at a temperature of 800° C. by using TMG, TMI, $NH_3$ and $Cp_2Mg$. The hole carrier concentration after annealing of this first p-type clad layer 157 was $2\times10^{17}/cm^3$.

Then, the same processes as in Example 3 were followed to form a second p-type clad layer 153 consisting of a Mg-doped p-type $Al_{0.3}Ga_{0.7}N$, and a p-type contact layer 159 consisting of Mg-doped p-type GaN. Then, the same processes as in Example 8 were followed to obtain an LED device shown in FIG. 11. This LED device exhibited an emission at 420 nm in peak wavelength and 3.5 V in Vf under an If of 20 mA. The half band width of the emission spectrum was 20 nm, and the emission output of the LED was 9 mW.

Example 11

The same processes as in Example 8 were followed up to the formation of a second n-type clad layer 154 consisting of Si-doped n-type $Al_{0.3}Ga_{0.7}N$. Then, a first n-type clad layer 155 having a thickness of 500 angstroms and consisting of Si-doped n-type GaN was grown on the second n-type clad layer 154. The electron carrier concentration of this first n-type clad layer 155 was $2\times10^{19}/cm^3$.

Then, an active layer 156 having a thickness of 40 angstrorns and consisting of a non-doped $In_{0.05}Ga_{0.95}N$ was deposited on the first n-type clad layer 155 in the same manner as in Example 10.

Then, the same processes as in Example 8 were followed to form a second p-type clad layer 158 consisting of a Mg-doped p-type $Al_{0.3}Ga_{0.7}N$ and a p-type contact layer 159 consisting of Mg-doped p-type GaN. Then, the same processes as in Example 8 were followed to obtain an LED device. This LED device exhibited an emission of 415 nm in peak wavelength and 3.5 V in Vf under an If of 20 mA. The half band width of the emission spectrum was 20 nm, and the emission outout of the LED was 5 mW.

Example 12

The same processes as in Example 8 were followed, except that the composition of the active layer 126 was $In_{0.2}Ga_{0.8}N$, thereby obtaining an LED device. This LED device exhibited a blue emission at 455 nm in peak wavelength and 3.5 V in Vf under an If of 20 mA. The half band width of the emission spectrum was 20 nm, and the emission output of the LED was 5 mW.

Example 13

The same procedures were followed to form an LED device as in Example 8, except that an active layer 126 was of a multi-quantwn well structure. Specifically, a non-doped $In_{0.1}Ga_{0.9}N$ well film having a thickness of 20 angstroms was grown and then an $In_{0.02}Ga_{0.98}N$ barrier film having a thickness of 20 angstroms was grown, at a temperature of 800° C. by using TMG, TMI and $NH_3$. Then, grown. This process was repeated three times, and finally an $In_{0.1}Ga_{0.9}N$ well film having a thickness of 20 angstroms was grown to obtain the active layer 126 of the multi-quantum well structure having a total thickness of 140 angstroms. The LED device thus prepared exhibited a blue emission of 420 nm in peak wavelength and 3.5 V in Vf under an If of 20 mA. The emission output of the LED was 7 mW.

Example 14

The same procedures as in Example 8 were followed to prepare an LED device, except that DEZ (diethylzinc) was employed as an acceptor impurity, silane gas was employed as a donor impurity to form an n-type $In_{0.05}Ga_{0.95}N$ layer having a thickness of 50 angstroms and doped with Si and Zn. The LED device thus obtained exhibfted a blue emission 450 nm in peak wavelength, 3.5 V in Vf and 70 nm in half band width under an If of 20 mA. The emission output of the LED was 3 mW.

Example 15

In the same manner as in Example 8, a first n-type clad layer 125 consisting of Si-doped n-type $In_{0.01}Ga_{0.99}N$, an active layer 126 consisting of non-doped $In_{0.05}Ga_{0.95}N$, a second p-type clad layer 128 consisting of Mg-doped p-type $Al_{0.3}Ga_{0.7}N$, and a p-type contact layer 129 were successively grown on an n-type contact layer 123. Namely, the same procedures as Example 8 were followed to prepare an LED, except that the second n-type clad layer 124 was not formed. The LED device thus prepared exhibited an emission of 410 nm in peak wavelength and 3.5 V in Vf under an If of 20 mA. The emission output of the LED was 5 mW.

Example 16

This Example 16 will be explained with reference to FIGS. 12 and 13 as follows.

The same procedures as explained in Example 8 were followed up to the formation of the n-type contact layer 153. Then, the temperature was lowered down to 800° C., and a thin film consisting of Si-doped n-type $In_{0.01}Ga_{0.99}N$ having a thickness of 380 angstroms was grown by using TMG, TNI, $NH_3$ and silane gas. Then, after the temperature was raised up to 1050° C., a thin film consisting of Si-doped n-type $Al_{0.2}Ga_{0.8}N$ having a thickness of 390 angstroms was grown by using TMG, TMA, $NH_3$ and silane gas. These procedures were repeated 20 time, thereby growing a first n-type multi-layered film 100 comprising ten layers of Si-doped n-type $In_{0.01}Ga_{0.99}N$ laminated alternately with ten layers of Si-doped n-type $Al_{0.2}Ga_{0.8}N$.

Then, a second n-type clad layer 154, a first n-type clad layer 155, an active layer 156, a first p-type clad layer 157 and a second p-type clad layer 158 were successively deposited in the same manner as in Example 10.

Subseguently, the temperature was lowered down to 800° C., and by using TMG, TNI, $NH_3$ and $Cp_2Mg$, a Mg-doped p-type $In_{0.01}Ga_{0.99}N$ layer having a thickness of 380 angstroms was grown. Then, the temperature was raised up again to 1050° C., upon which TMG, TMA, $NH_3$ and $Cp_2Mg$ gas were employed to grow an Mg-doped p-type $Al_{0.2}Ga_{0.8}N$ having a thickness of 390 angstroms. These procedures were repeated, thereby obtaining a second p-type multi-layered film 200 comprising ten layers of Mg-doped p-type $In_{0.01}Ga_{0.99}N$ laminated alternately with ten layers of Mg-doped p-type $Al_{0.2}Ga_{0.8}N$.

After the formation of the second p-type multi-layered film 200, a p-type contact layer 159 was grown on the surface of the second p-type multi-layered film 200 in the same manner as in Example 8 to prepare a wafer.

Then, after performing an etching of the nitride semiconductor layers in the same manner as in Example 8, a mask of prescribed pattern was formed on the surface of the uppermost p-type contact layer 159 so as to form a negative electrode 50 μm in width on the n-type contact layer 153, and to form a positive electrode 10 μm in width on the p-type contact layer 159. When the first n-type multi-layered film 100 was formed on the n-type contact layer 153, a horizontal surface for bearing a negative electrode could be automatically disposed lower than the level of the first n-type multi-layered film 100 as shown in FIG. 12.

Then, the surface of the sapphire substrate 151 on which the nitride semiconductor layers were not formed was polished to reduce the thickness of the substrate to 90 μm. Then, the M-plane of the sapphire substrate 151 was scribed and the resultant wafer was cut into chips, each 700 μm×700 μm square, and fabricated into a laser of stripe type as shown in FIG. 13. FIG. 13 corresponds to a perspective view of the laser device according to this Example, wherein the plane of the nitride semiconductor layers which perpendicularly intersect with the positive electrode of stripe-like shape constitutes an optical resonance surface. The whole surface excluding the electrodes were covered with an insulating film (not shown). Then, the chip thus obtained was set in a heat sink and each electrode was wire-bonded. When this chip was subjected to laser oscillation at room temperature, a laser oscillation at 390 nm under a threshold current density of 1.5 kA/cm$^2$ was confirmed.

Example 17

This Example 17 will be explained with reference to FIG. 16 as follows.

First, using TMG and NH$_3$ as raw materials, a buffer layer 312 having a thickness of 500 angstroms and consisting of GaN was grown at a temperature of 500° C. on the C-plane of a sapphire substrate 311 which had been set in advance in a reaction vessel.

Then, the temperature was raised up to 1050° C., upon which silane gas was added in addition to the TMG and NH$_3$, thereby growing an n-type contact layer 313 having a thickness of 4 μm and consisting of an Si-doped n-type GaN.

Then, TMA was added, while keeping the same temperature of 1050° C., to the raw material gas, thereby growing a second n-type clad layer 314 having a thickness of 0.1 μm and formed of an Si-doped n-type Al$_{0.3}$Ga$_{0.7}$N.

Subsequently, the temperature was lowered down to 800° C., and by using TMG, TMI, NH$_3$ and silane gas, a first n-type clad layer 315 having a thickness of 500 angstroms and formed of an Si-doped n-type In$_{0.01}$Ga$_{0.99}$N was grown.

While keeping this temperature of 800° C. and by using TMG, TMI and NH$_3$, an active layer 316 of a single-quantum well structure having a thickness of 30 angstroms and consisting of non-doped In$_{0.8}$Ga$_{0.2}$N was grown.

Then, by using Cp$_2$Mg in addition to TMG, TMI and NH$_3$, a first p-type clad layer 317 having a thickness of 500 angstroms and consisting of an Mg-doped p-type In$_{0.01}$Ga$_{0.99}$N was grown at a temperature of 800° C.

Then, the temperature was raised up again to 1050° C., upon which TMG, TMA, NH$_3$ and Cp$_2$Mg were employed to grow a second p-type clad layer 318 having a thickness of 0.1 μm and consisting of an Mg-doped p-type Al$_{0.3}$Ga$_{0.7}$N.

While keeping this temperature of 1050° C. and by using TMG, TMA, NH$_3$ and Cp$_2$Mg, a p-type contact layer 319 having a thickness of 0.5 μm and consisting of an Mg-doped p-type GaN was grown.

After the completion of the reaction, the temperature was lowered down to room temperature, and the wafer obtained was taken out and then the annealing of the wafer was performed at a temperature of 700° C. so as to lowering the resistivity of the p-type layers. Then, after forming a mask of prescribed pattern on the surface of the uppermost p-type contact layer 319, an etching was performed so as to allow the surface of the n-type contact layer 313 to expose out of the uppermost p-type contact layer 319. After finishing the etching, a negative electrode formed of Ti and Al was formed on the surface of the n-type contact layer 313, and then a positive electrode formed of Ni and Au was formed on the surface of the p-type contact layer 319.

After the electrodes were formed in this manner, the surface of the resultant wafer was cut into chips, each 350 μm×350 μm square, and fabricated into an LED device having a viewing angle of 15 degrees. This LED device exhibited a red emission at 650 nm in peak wavelength and 3.5 V in Vf under an If of 20 mA. The emission output of the LED was 0.7 mW.

Example 13

The same processes as in Example 17 were followed to prepare an LED, except that the active layer 316 in this example had a composition of In$_{0.05}$Ga$_{0.95}$N and a thickness of 10 angstroms. This LED device exhibited a bluish purple emission at 425 nm in peak wavelength under an If of 20 mA. The emission output of the LED was 5 mW. The half band width of the emission sDectrum was 20 nm exhibiting an emission of high color purity.

Example 19

The same procedures as in Example 17 were followed to prepare an LED, except that the composition of the active layer 316 was changed to a non-doped In$_{0.2}$Ga$_{0.8}$N. This LED device exhibited a blue emission 465 nm in peak wavelength under an If of 20 mA. The emission output of the LED was 5 mW. The half band width of the emission spectrum was 25 nm exhibiting a blue emission of high color purity.

Example 20

The same procedures as in Example 17 were followed to prepare an LED device, except that an Si-doped n-type In$_{0.01}$Ga$_{0.99}$N layer having a thickness of 300 angstroms was grown as the first n-type clad layer 315, a non-doped n-type In$_{0.3}$Ga$_{0.7}$N layer having a thickness of 10 angstroms was grown as the active layer, and an Mg-doped In$_{0.01}$Ga$_{0.99}$N layer having a thickness of 300 angstroms was grown as the first p-type clad layer 317. This LED device exhibited a green emission at 500 nm in peak wavelength, 3.5 V in Vf and 40 nm in half band width under an If of 20 mA. The emission output of the LED was 4 mW.

Example 21

In the procedures of Example 17, after the formation of the n-type contact layer 313, an active layer 316 of a single-quantum well structure consisting of an In$_{0.4}$Ga$_{0.6}$N layer having a thickness of 70 angstroms was directly deposited on the n-type contact layer 313. In this case, the n-type contact layer 313 was intended to function as a first n-type clad layer. Then, the second p-type clad layer 318 was grown on the active layer 316, and the p-type contact layer 319 was grown thereon. Subsequent processes were performed in the same manner as in Example 17, thereby obtaining an LED device. This LED device exhibited a green emission at 525 nm in peak wavelength, 3.5 V in Vf and 40 nm in half band width under an If of 20 mA. The emission output of the device was 4 mW.

Example 22

The same procedures as in Example 17 were followed to prepare an LED device, except that an Si-doped n-type GaN layer having a thickness of 300 angstroms was grown as the first n-type clad layer 315, then a non-doped $In_{0.3}Ga_{0.7}N$ layer having a thickness of 20 angstroms was grown as the active layer 316, and then an Mg-doped p-type GaN layer having a thickness of 300 angstroms was grown as the first p-type clad layer 317. The LED device thus obtained exhibited a green emission at 515 nm in peak wavelength, 3.5 V in Vf and 40 nm in half band width under an If of 20 mA. The emission output of the device was 3 mW.

Example 23

The same procedures as in Example 17 were followed to prepare an LED, except that DEZ was employed as an acceptor impurity source, and silane gas was employed as a donor impurity source to form an n-type $In_{0.05}Ga_{0.95}N$ layer having a thickness of 50 angstroms and doped with Si and Zn as an active layer 316. The LED device thus obtained exhibited a green emission at 480 nm in peak wavelength, 3.5 V in Vf and 80 nm in half band width under an If of 20 mA. The emission output of the LED device was 2 mW.

Example 24

In the procedures of Example 17, a Si-doped n-type $In_{0.01}Ga_{0.99}N$ layer having a thickness of 500 angstroms was grown as the first n-type clad layer 315. Then, in order to prepare an active layer, a non-doped $In_{0.15}Ga_{0.85}N$ layer having a thickness of 10 angstroms was grown as a well layer and a non-doped $In_{0.05}Ga_{0.95}N$ layer having a thickness of 10 angstroms was grown as a barrier layer on the well layer. These processes were alternately repeated four times, and finally a non-doped $In_{0.15}Ga_{0.85}N$ well layer having a thickness of 10 angstroms was grown, thereby forming the active layer of a multi-quantum well structure having a total thickness of 90 angstroms. Subsequently, a Mg-doped p-type $In_{0.01}Ga_{0.99}N$ layer having a thickness of 500 angstroms was grown as a first p-type clad layer on the active layer 316. Subsequent processes were performed in the same manner as in Example 17, thereby obtaining a wafer.

Then, an etching was performed on the nitride semiconductor layers in the same manner as in Example 17, and a mask of prescribed pattern was formed on the p-type contact layer constituting the uppermost layer. Thereafter, a negative electrode having a width of 20 μm was formed on the n-type contact layer 313, and a positive electrode having a width of 2 μm was formed on the p-type contact layer 319.

Then, the surface of the sapphire substrate 151 on which the nitride semiconductor layers were not formed was polished to reducing the thickness of the substrate to 90 μm. Then, the M-plane of the sapphire substrate was scribed and the resultant wafer was cut into chips, each 700 μm×700 μm square, and fabricated into a laser of stripe type as shown in FIG. 13. FIG. 13 shows a perspective view of the laser device according to this Example, wherein the plane of the nitride semiconductor layers which perpendicularly intersect with the positive electrode of stripe-like shape constitutes an optical resonance surface. Then, the chip thus obtained was set in a heat sink and each electrode was wire-bonded. When this chip was subjected to laser oscillation, a laser oscillation at 390 nm under a threshold current density of 1.5 kA/cm$^2$ was confirmed.

Example 25

The same procedures as in Example 24 were followed to prepare an LD device except for the formations of the active layer and the first p-type clad layer. To form the active layer in this Example, a non-doped $In_{0.15}Ga_{0.85}N$ was grown to a thickness of 25 angstrorns as a well layer, and then a non-doped $In_{0.05}Ga_{0.95}N$ was grown to a thickness of 50 angstroms as a barrier layer on the well layer. This process was repeated 13 times, and finally the well layer was grown, thereby obtaining the active layer 316 of the multi-quantum well structure having a total thickness of 1,000 angstroms. On this active layer 316, a first p-type clad layer having a thickness of 500 angstroms and consisting of Al0.05Ga0.95N was grown. The LD device thus obtained exhibited a laser oscillation at 415 nm under a threshold current density of 1.0 kA/cm$^2$.

Example 26

The same procedures as in Example 24 were followed to prepare an LD device except for the formations of the active layer. To form the active layer in this Example, a non-doped $In_{0.15}Ga_{0.85}N$ was grown to a thickness of 25 angstroms as a well layer, and then a non-doped $In_{0.05}Ga_{0.95}N$ was grown to a thickness or 50 angstroms as a barrier layer on the well layer. This process was repeated 26 times, and finally the well layer was grown, thereby obtaining the active layer 316 of the multi-quantum well structure having a total thickness of 1,975 angstroms. The LD device thus obtained exhibited a laser oscillation at 415 nm under a threshold current density of 4.0 kA/cm$^2$ at a room temperature.

Example 27

A blue LED of 450 nm obtained in Example 7, a green LED of 515 nm obtained in Example 21 and a red LED of 660 nm in emission wavelength and 3 mW in emission output which is formed of the conventional GaAs-based material or AlInGaP-based material were assembled as one dot, and a LED panel comprising a combination of 16×16 (dots) was fabricated. Subsequently, a plurality of the LED panels were arranged to prepare a full-color LED display having 320×240 pixels. The display was capable of emitting ten thousand nits of surface emission in white luminance.

As explained above, it is possible according to the present invention to provide an LED device and an LD device which are excellent in emission output and brightness.

What is claimed is:

1. A nitride semiconductor light-emitting device comprising:

an active layer having first and second main surfaces, and comprising a nitride semiconductor containing indium and gallium;

an n-type semiconductor layered structure provided over said first main surface of the active layer, said n-type semiconductor layered structure comprising a first n-type clad layer comprising an n-type nitride semiconductor containing indium and gallium, and having a larger band gap than said active layer, a second n-type clad layer comprising an n-type nitride semiconductor containing aluminum and gallium and having a larger band gap than that of the first clad layer, and an n-type contact layer formed of an n-type GaN; and a first multi-layered film, acting as a light reflecting film, comprising at least two nitride semiconductor layers differing in composition and provided between said second n-type clad layer and said n-type contact layer, or in said n-type clad layer, wherein said second n-type clad layer is provided further than said first n-type clad layer from said first main surface of the active layer, and said n-type contact layer is provided further than said second n-type clad layer from said second main surface of the active layer.

2. A nitride semiconductor light-emitting device comprising:

an active layer having first and second main surfaces, and comprising a nitride semiconductor containing indium and gallium;

a p-type semiconductor layered structure provided over said second main surface of the active layer, said p-type semiconductor layered structure comprising a first p-type clad layer comprising a p-type nitride semiconductor containing indium and gallium having a larger band gap than said active layer, a second p-type clad layer comprising a p-type nitride semiconductor containing aluminum and gallium having a larger band gap than that of the first clad layer, and a p-type contact layer formed of a p-type GaN; and a multi-layered film, acting as a light reflecting film, comprising at least two nitride semiconductor layers differing in composition and provided between said second p-type clad layer and said p-type contact layer, or in said p-type contact layer, wherein said second p-type clad layer is provided further than said first p-type clad layer from said second main surface of the active layer, and said p-type contact layer is provided further than said second p-type clad layer from said second main surface of the active layer.

3. A nitride semiconductor light-emitting device comprising:

an active layer having first and second main surfaces, and comprising a nitride semiconductor containing indium and gallium;

an n-type semiconductor layered structure provided over said first main surface of the active layer, said n-type semiconductor layered structure comprising a first n-type clad layer comprising an n-type nitride semiconductor containing indium and gallium and having a larger band gap than said active layer, and a second n-type clad layer comprising an n-type nitride semiconductor containing aluminum and gallium and having a larger band gap than said first clad layer; and a p-type semiconductor layered structure provided over said second main surface of the active layer, said p-type semiconductor layered structure comprising a first p-type clad layer comprising a p-type nitride semiconductor containing indium and gallium and having a larger band gap than said active layer, and a second p-type clad layer comprising a p-type nitride semiconductor containing aluminum and gallium and having a larger band gap than said first clad layer, at least one multi-layered light reflecting film selected from a first multi-layered light reflecting film comprising at least two nitride semiconductor layers differing in composition and provided between said second n-type clad layer and said n-type contact layer, or in said n-type contact layer, and a second multi-layered light reflecting film comprising at least two nitride semiconductor layers differing in composition and provided between said second p-type clad layer and said p-type contact layer, or in said p-type contact layer, wherein said second n-type clad layer is provided further than said first n-type clad layer from said first main surface of the active layer, and said second p-type clad layer is provided further than said first p-type clad layer from said second main surface of the active layer.

4. The device according to claim 1, 2 or 3, wherein one of said two nitride semiconductor layers forming said multi-layered film is a nitride semiconductor containing indium and gallium, or GaN, and the other of said two nitride semiconductor layers forming said multi-layered film is a nitride semiconductor containing aluminum and gallium.

* * * * *

UNITED STATES PATENT AND TRADEMARK OFFICE
CERTIFICATE OF CORRECTION

PATENT NO.    : 6,580,099 B2
DATED         : June 17, 2003
INVENTOR(S)   : Nakamura et al.

It is certified that error appears in the above-identified patent and that said Letters Patent is hereby corrected as shown below:

Title page,
Item [63], Related U.S. Application Data, should read -- Continuation of application No. 09/370,170, filed on Aug. 9, 1999, now abandoned; which is a continuation of application No. 09/069,240, filed on April 29, 1998, now abandoned; which is a divisional of application No. 08/565,101, filed November 30, 1995, now U.S. Patent No. 5,777,350. --

Signed and Sealed this

Twentieth Day of July, 2004

JON W. DUDAS
*Acting Director of the United States Patent and Trademark Office*